United States Patent
Wang

(10) Patent No.: US 8,324,939 B2
(45) Date of Patent: Dec. 4, 2012

(54) DIFFERENTIAL LOGIC CIRCUIT, FREQUENCY DIVIDER, AND FREQUENCY SYNTHESIZER

(75) Inventor: Jianqin Wang, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/931,158

(22) Filed: Jan. 26, 2011

(65) Prior Publication Data

US 2011/0181320 A1    Jul. 28, 2011

(30) Foreign Application Priority Data

Jan. 27, 2010   (JP) ................................. 2010-015219

(51) Int. Cl.
*H03K 19/20*   (2006.01)
*H03B 19/00*   (2006.01)
(52) U.S. Cl. ........................................ 326/115; 327/117
(58) Field of Classification Search .............. 326/82–87, 326/115; 327/108, 109, 117
See application file for complete search history.

(56) References Cited

U.S. PATENT DOCUMENTS

| | | | | |
|---|---|---|---|---|
| 5,982,690 A * | 11/1999 | Austin | ........................... | 365/205 |
| 6,420,914 B1 * | 7/2002 | Hasegawa | ..................... | 327/112 |
| 6,519,963 B2 * | 2/2003 | Maeda | ........................... | 62/259.2 |
| 7,288,971 B1 * | 10/2007 | Plasterer et al. | ............... | 326/127 |
| 2005/0285678 A1 * | 12/2005 | Kaviani et al. | ................ | 330/261 |
| 2006/0061391 A1 * | 3/2006 | Tam | ............................... | 326/115 |
| 2006/0066393 A1 * | 3/2006 | Davis et al. | .................... | 327/563 |
| 2007/0001719 A1 * | 1/2007 | Hulfachor et al. | ............. | 327/117 |
| 2008/0197897 A1 | 8/2008 | Iwaida et al. | | |
| 2009/0002076 A1 * | 1/2009 | Hayashi et al. | ................ | 330/304 |
| 2009/0309857 A1 * | 12/2009 | Nishimura | ..................... | 345/205 |

FOREIGN PATENT DOCUMENTS

| | | |
|---|---|---|
| JP | 2007-116257 A | 5/2007 |
| JP | 2008-205601 A | 9/2008 |

* cited by examiner

*Primary Examiner* — Thienvu Tran

(74) *Attorney, Agent, or Firm* — McGinn IP Law Group, PLLC

(57) ABSTRACT

A differential logic circuit includes: a differential logic unit which receives a plurality of logic signals, performs a logic operation, and outputs a result of the logic operation from a pair of differential signal output terminals thereof; and a current source circuit which supplies current to the differential logic unit and which controls a magnitude of the current. The differential logic circuit further includes: a load circuit connected to the differential signal output terminals; and a load control circuit which is connected to the load circuit and controls a load of the load circuit such that a direct-current output voltage of the pair of differential signal output terminals is constant.

19 Claims, 18 Drawing Sheets

DIFFERENTIAL LOGIC CIRCUIT, FREQUENCY DIVIDER, AND FREQUENCY SYNTHESIZER

TECHNICAL FIELD

Reference to Related Application

This application is based upon and claims the benefit of the priority of Japanese patent application No. 2010-15219, filed on Jan. 27, 2010, the disclosure of which is incorporated herein in its entirety by reference thereto. The present invention relates to a differential logic circuit, a frequency divider, and a frequency synthesizer. More specifically, the invention relates to a differential latch circuit of which an operating current can be controlled, a frequency divider and a frequency synthesizer both using the differential latch circuit.

BACKGROUND

Frequency synthesizers are widely used in communication devices, mobile communication terminals, and high-frequency integrated circuits used for the mobile communication terminals in order to generate a high-frequency communication carrier. FIG. 1 is a block diagram showing a configuration of a common frequency synthesizer. The frequency synthesizer shown in FIG. 1 is a PLL frequency synthesizer including a voltage controlled oscillator (VCO) 200, a frequency divider 910, a phase comparator and charge pump 220, and a loop filter 230. An oscillation frequency of the voltage controlled oscillator (VCO) 200 is controlled by a control voltage output by the loop filter 230. The voltage controlled oscillator 200 outputs a high-frequency clock signal fvco. The clock signal fcvo can be used as a high-frequency communication carrier. The frequency divider 910 frequency-divides the high-frequency clock signal fvco. The phase comparator and charge pump 220 includes a phase comparator that compares the frequency and the phase of the clock signal frequency-divided by the frequency divider 910 with those of a reference clock used as a reference, and a charge pump circuit that charges or discharges electrical charge based on a result of comparison by the phase comparator. The loop filter 230 smoothes the electrical charge charged or discharged by the charge pump to generate the control voltage for controlling the oscillation frequency of the voltage controlled oscillator (VCO) 200. With this configuration, as the clock signal output by the frequency divider 910, a signal of a desired frequency in phase with the reference clock can be obtained. Further, by forming the frequency divider of a variable frequency circuit and changing a frequency division ratio, the clock signal fvco output by the voltage controlled oscillator VCO can be set to a desired frequency.

In the configuration of the frequency synthesizer, each of the voltage controlled oscillator 200 and the frequency divider 910 operates at a high frequency. Thus, large power is consumed. Further, in recent years, an upper limit frequency for use has been increased to accommodate multiple bands and bandwidth expansion in wireless communications. Thus, frequency synthesizers consume larger power. On the other hand, in order to operate communication devices and mobile communication terminals in particular for a long period of time and to further reduce the sizes of the terminals by reducing battery sizes thereof, reduction of power consumption of entire transmitter/receiver circuits and the frequency synthesizers are demanded.

Patent Document 1 describes a PLL circuit that consumes low power and accommodates a wide oscillation frequency range. FIG. 2 is a block diagram of the PLL circuit (frequency synthesizer) described in Patent Document 1. Among components of the PLL circuit in FIG. 2, a voltage controlled oscillator 200, a frequency divider 911, a first phase comparator 921, a charge pump 922, and a filter 230 substantially correspond to the components in the frequency synthesizer described in FIG. 1. In addition to these components, the PLL circuit in FIG. 2 includes a second phase comparator 923 and a current control circuit 924. The second phase comparator 923 obtains a phase difference between a clock signal fDIV frequency-divided by the frequency divider 911 and a reference clock signal fREF using a period of time longer than that for the first phase comparator 921, by temporal averaging. The current control circuit 924 controls an operating current of the frequency divider 911, based on a result of comparison using the second phase comparison circuit 923. According to the configuration in FIG. 2, it is detected whether or not the PLL circuit has entered into a stable locked state by the second phase comparator, and the operating current of the frequency divider 911 is reduced when the PLL circuit has entered into the stable locked state. Power consumption of the frequency divider can be thereby reduced.

FIG. 3 shows an internal configuration of the frequency divider 911 described in Patent Document 1. The frequency divider 911 is constituted from a fixed frequency divider 912 that receives and frequency-divides an oscillation signal fvco of the voltage controlled oscillator, a prescaler 913 that further frequency-divides the frequency obtained by frequency division by the fixed frequency divider 912 to reduce the frequency, and a programmable counter 914 that is a variable frequency divider. An output signal of the programmable counter 914 is phase compared with the reference clock by the phase comparator. A control input terminal 915 is provided at the fixed frequency divider 912 that operates at a highest speed among these components, and the operating current can be controlled by the current control circuit 924.

A ½ frequency divider constituted from a combination of a plurality of differential latch circuits is used for a circuit that operates at a high frequency, such as the fixed frequency divider 912. A traditional differential latch circuit 900 is shown in FIG. 4, and a ½ frequency divider using differential latch circuits 900 is shown in FIG. 5. The differential latch circuit shown in FIG. 4 includes a differential pair (M1, M4) that constitute a data input unit, a holding unit (M2, M3), a current source 930, and load resistances R11 and R12. Data signals received from data terminals D and Db are latched in synchronization with clock signals received from clock terminals Ck and Ckb to be output from data output terminals Q and Qb.

The ½ frequency divider 990 shown in FIG. 5 is a frequency divider in which clock signals supplied from clock terminals Ck and Ckb are ½ frequency-divided by two differential latch circuits 900-1 and 900-2 in FIG. 4 to be output from data output terminals Q and Qb. Since the differential latch circuit shown in FIG. 4 and the ½ frequency divider shown in FIG. 5 operate in a differential manner, a high-speed operation is possible. A latch circuit and a frequency divider corresponding to the differential latch circuit in FIG. 4 and the ½ frequency divider in FIG. 5 are described in Patent Document 2.

[Patent Document 1]
JP Patent Kokai Publication No. JP2008-205601A, which corresponds to US Patent Application Publication No. US2008/0197897A1.
[Patent Document 2]
JP Patent Kokai Publication No. JP2007-116257A

SUMMARY

Each disclosure of the above identified Patent Publications is incorporated herein by reference thereto. The following analysis is given by the present invention. It may also be considered that, in the fixed frequency divider 912 in FIG. 3, by using the ½ frequency divider in FIG. 5 or a frequency divider formed by using a plurality of the differential latch circuits in FIG. 4 and controlling the magnitude of current that is flown through a current source 930, an operating frequency of the fixed frequency divider 912 is adjusted and a current value is set according to a desired operating frequency. A fall speed at the data output terminal Q or Qb in the differential latch circuit in FIG. 4 can be controlled by the current that is flown through the current source 930.

However, a rise speed at the data output terminal Q or Qb is determined by the resistance value of the load resistance R11 or R12, an element connected to the output terminal, and a wiring parasitic capacitance. Thus, the rise speed does not vary even if the current that is flown through the current source 930 is varied. That is, when the traditional differential latch circuit as described in FIG. 4 is used, the fixed load resistances are used, so that the rise speed at the data output terminal Q or Qb does not vary even if the magnitude of the current that is flown through the current source is adjusted. Thus, a maximum toggle frequency variable range of the differential latch circuit is small. When the current that is flown through the current source is varied, a direct-current output voltage of the differential latch circuit is varied, thereby affecting an operation in the next stage. Thus, the current that is flown through the current source cannot be greatly varied. Accordingly, in the frequency divider circuit using the traditional differential latch circuit, the adjustment range of a maximum operable frequency of the frequency divider circuit implemented by adjustment of the circuit current is narrow. The differential latch circuit and the frequency divider as described above cannot accommodate a frequency synthesizer used in terminals for mobile communication in which lower power consumption, bandwidth expansion, and multiple bands in recent years have been promoted. A differential latch circuit and a frequency divider capable of accommodating a wide frequency range and implementing power consumption that is as low as possible in any frequency band is desired.

A first aspect of the present invention, there is provided a differential logic circuit that includes a differential logic unit which receives a plurality of logic signals, performs a logic operation, and outputs a result of the logic operation from a pair of differential signal output terminals thereof, and a current source circuit which supplies controllable current to the differential logic unit. The differential logic circuit further includes a load circuit connected to the differential signal output terminals and a load control circuit which is connected to the load circuit and controls a load of the load circuit such that a direct-current output voltage of the pair of differential signal output terminals is constant.

A second aspect of the present invention, there is provided a frequency divider including a plurality of differential logic circuits that function as a plurality of differential latch circuits. The differential logic unit of the differential logic circuit includes a differential pair which is connected to the pair of differential signal output terminals and receives a plurality of the logic signals as data signals; a holding unit that holds states of the differential signal output terminals; and a switch circuit which receives a pair of the differential logic signals as differential clock signals and selectively connects the differential pair or the holding unit to the current source circuit, based on the differential clock signals; and the differential logic circuit functions as a data latch. In the frequency divider, the differential latch circuits are cascaded so that output signals of the differential signal output terminals in a preceding stage are supplied as the logic signals in a subsequent stage, and output signals of the differential signal output terminals in one of subsequent stages are supplied as the logic signals in an initial stage, the differential clock signals are supplied in common to the cascaded differential latch circuits, and frequency division is performed in synchronization with the differential clock signals.

A third aspect of the present invention, there is provided a frequency divider that includes a first differential latch circuit and a second differential latch circuit. The first and second differential latch circuits are the differential logic circuits each of which functions as a data latch. The differential logic unit of the differential logic circuit comprises a differential pair which is connected to the pair of differential signal output terminals and receives a plurality of the logic signals as data signals, a holding unit that holds states of the differential signal output terminals, a switch circuit which receives a pair of the differential logic signals as differential clock signals and selectively connects the differential pair or the holding unit to the current source circuit based on the differential clock signals. Phases of the clock signals are inverted between the first differential latch circuit and the second differential latch circuit, and the clock signals are connected in common. The pair of differential output terminals of the first differential latch circuit is connected to a pair of differential signal input terminals of the second differential latch circuit. The pair of differential output terminals of the second differential latch circuit is connected to a pair of differential signal input terminals of the first differential latch circuit. The load control circuit is connected in common to the first differential latch circuit and the second differential latch circuit.

A fourth aspect of the present invention, there is provided a frequency synthesizer that includes a voltage controlled oscillator, a frequency divider which frequency-divides an output signal of the voltage controlled oscillator, and a phase comparator which compares a phase of a clock signal obtained by frequency division by the frequency divider with a phase of a reference clock signal, the frequency synthesizer controlling a voltage of the voltage controlled oscillator to cause the voltage controlled oscillator to oscillate at a desired frequency, based on a difference between the phases compared by the phase comparator. In the frequency synthesizer, the frequency divider includes the differential logic circuit, the frequency synthesizer further includes, a control voltage selection switch which makes selection between supply of a voltage signal on the basis of the difference between the phases compared by the phase comparator and supply of a fixed voltage signal by which an oscillation frequency of the voltage controlled oscillator becomes maximum, as a signal for controlling the oscillation frequency of the voltage controlled oscillator, and an operating current adjustment unit which causes the control voltage selection switch to select the fixed voltage signal to cause the voltage controlled oscillator to oscillate at the maximum oscillation frequency, evaluates an output frequency of the frequency divider while varying the magnitude of the current that is flown through the current source circuit in the differential logic circuit, and then, based on a result of the evaluation, determines the magnitude of the current that is flown through the current source circuit when the operating current adjustment unit causes the control voltage selection switch to select the voltage signal on the basis of the difference between the phases compared by the phase comparator.

The meritorious effects of the present invention are summarized as follows. According to the differential logic circuit and/or the frequency divider of the present invention, the load of the load circuit is controlled such that the direct-current output voltage of the differential output terminals holds a constant value, irrespective of the magnitude of the current that is flown through the current source circuit. Thus, by controlling current that is flown through the current source circuit, an operating current can be varied in a wide range. Accordingly, a differential logic circuit and a frequency divider with a high-speed operation and low power consumption according to an operation speed required for the circuit can be obtained.

Further, according to the frequency synthesizer of the present invention, an optimal operating current of the frequency divider can be set according to an operating frequency required for the frequency divider.

PREFERRED MODES

Figure 1:
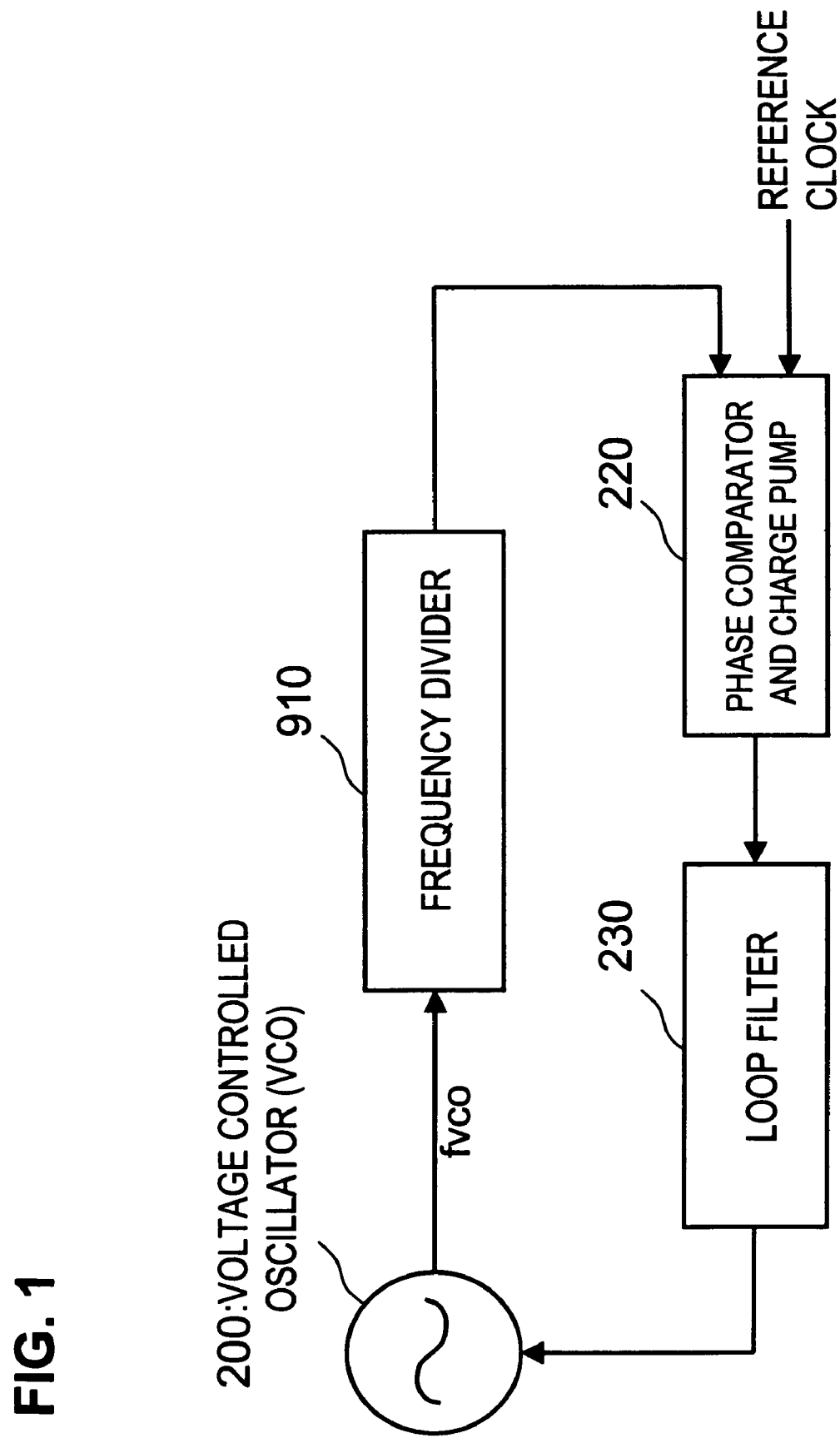
FIG. 1 is a block diagram showing a configuration of a common frequency synthesizer.
Figure 2:
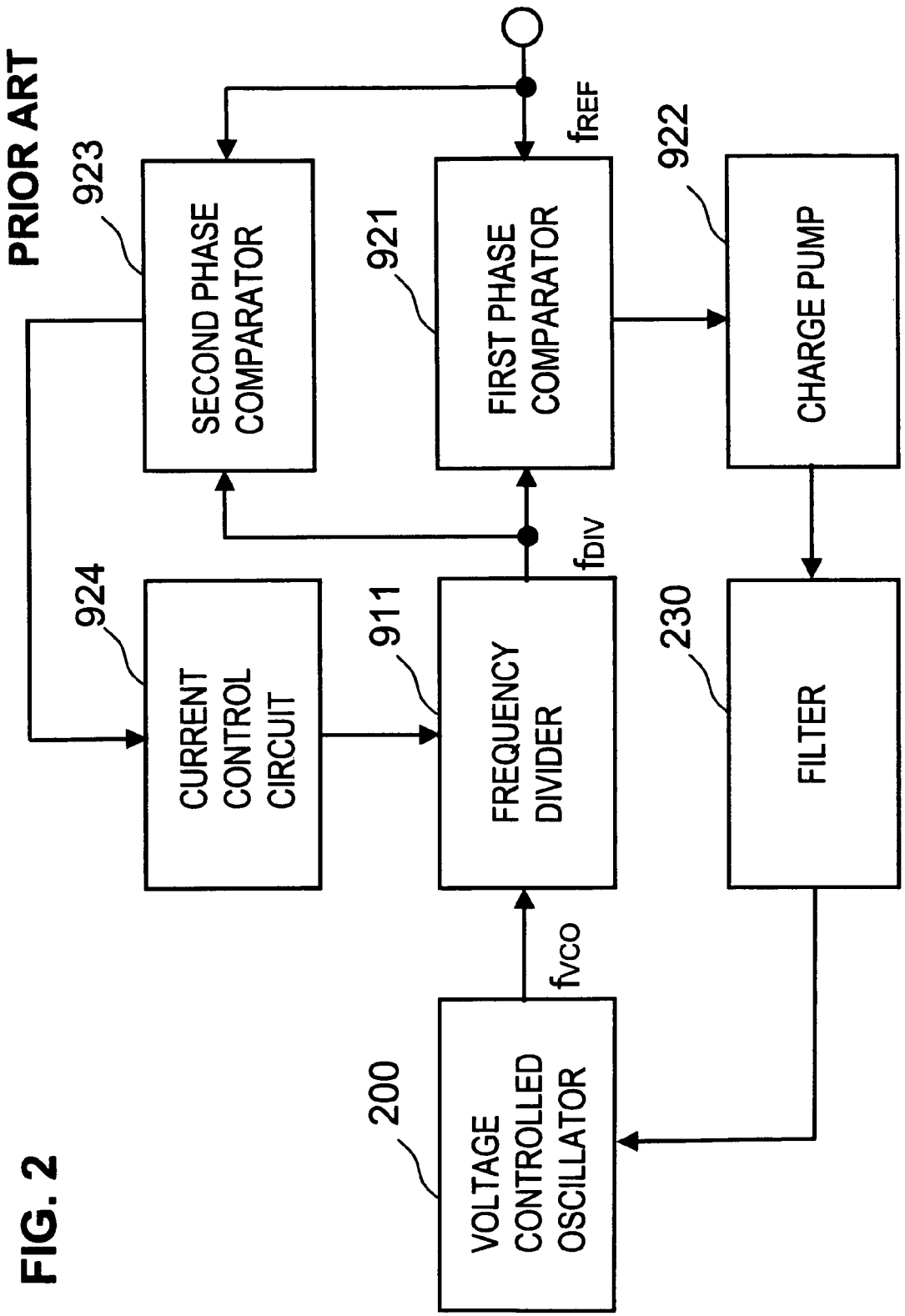
FIG. 2 is a circuit block diagram of a traditional frequency synthesizer described in Patent Document 1.

Before describing specific examples of the present invention, an overview of exemplary embodiments of the present invention will be described. Drawings and reference numerals in the drawings cited in the description of the overview are shown as an example of the exemplary embodiments, and do not thereby limit a variation of the exemplary embodiment of the present invention.

Figure 6:
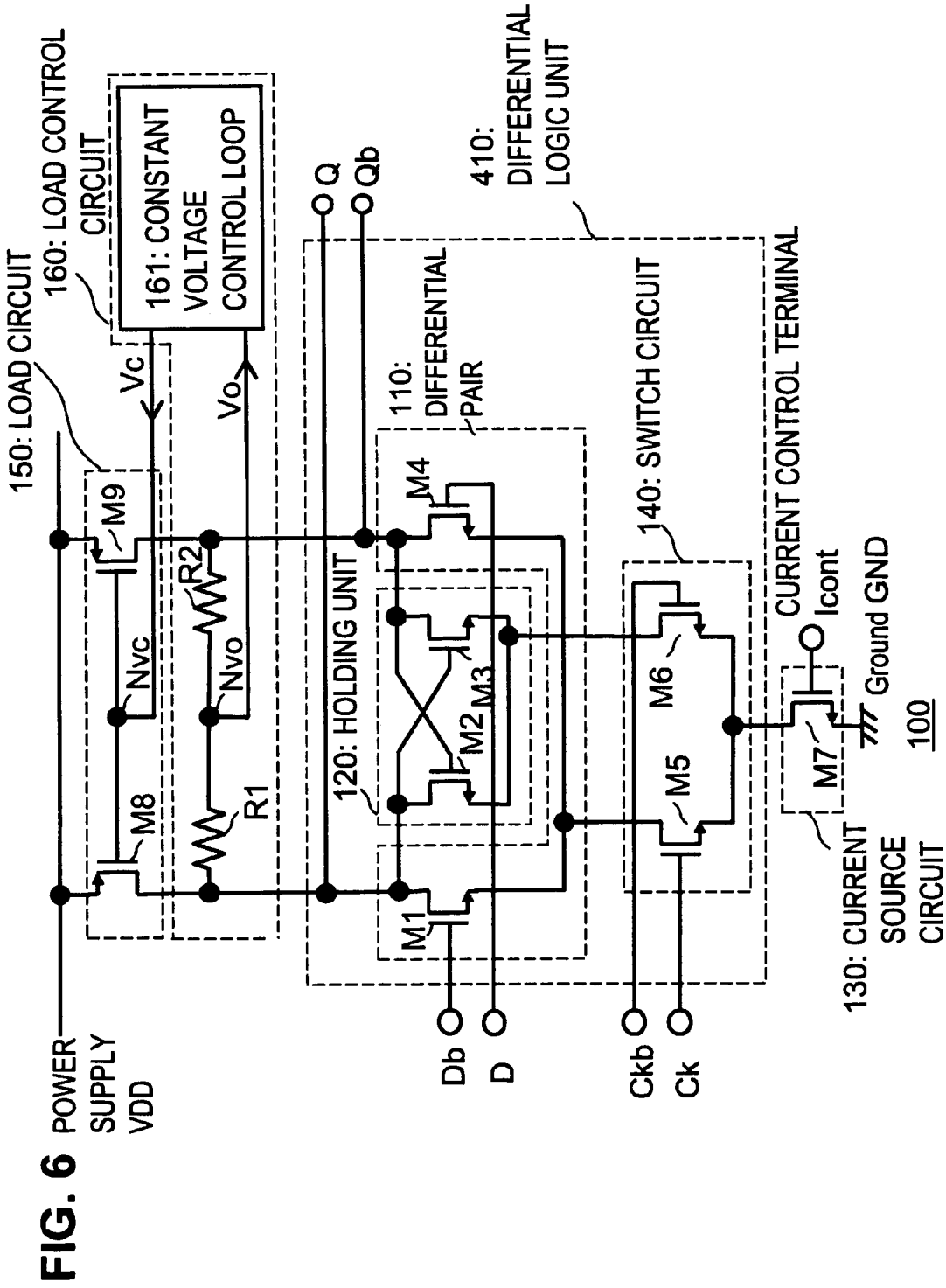
FIG. 6 is a circuit block diagram of a differential latch circuit in a first example of the present invention.
Figure 13:
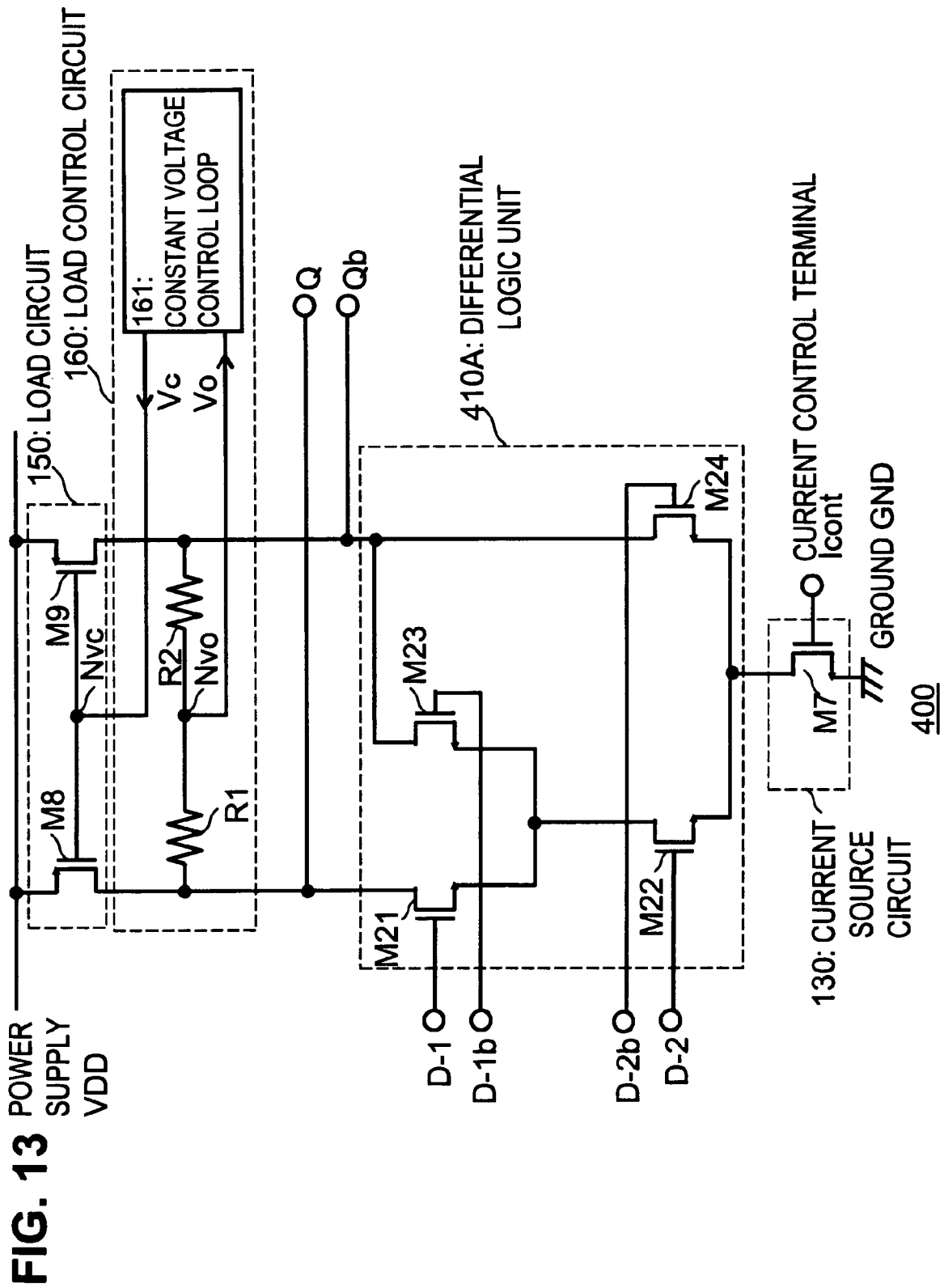
FIG. 13 is a circuit block diagram of a differential logic circuit in a fourth example.
Figure 15:
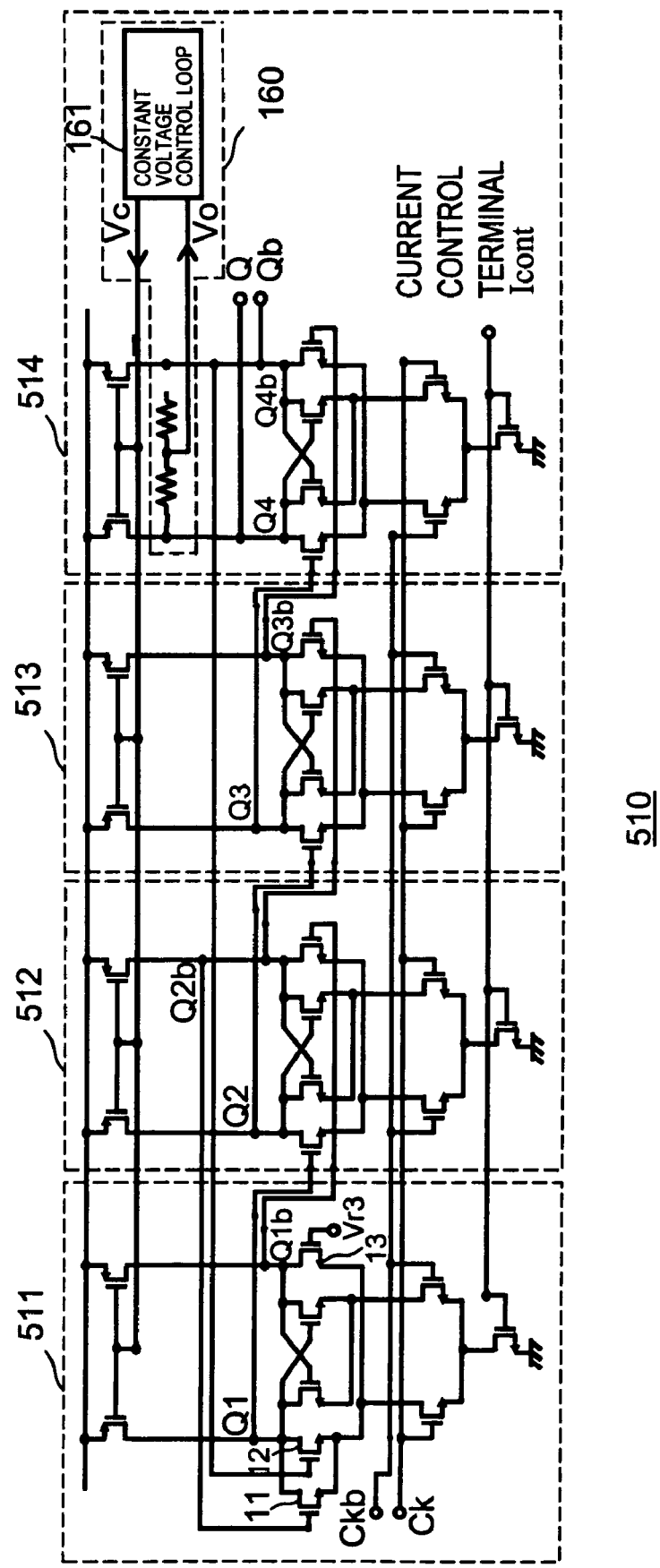
FIG. 15 is a circuit block diagram of a ⅓ frequency divider in a sixth example.

As shown in FIGS. 6, 13, 15 (indicating a differential logic circuit 511 in particular), and 16 (indicating a differential logic circuit 511A in particular), a differential logic circuit according to an exemplary embodiment of the present invention as an example includes a differential logic unit (410, 410A) which receives a plurality of logic signals (D, Db; Ck, Ckb; D-1, D-1b; D-2, D-2b; Q2b, Q4b; Q2b, Q4b, Q6), performs a logic operation, and outputs a result of the logic operation from a pair of differential signal output terminals (Q, Qb) thereof, a current source circuit 130 which supplies current to the differential logic unit (410, 410A) and which controls the magnitude of the current, a load circuit 150 connected to the pair of differential signal output terminals (Q, Qb), and a load control circuit 160 which is connected to the load circuit 150 and controls a load of the load circuit 150 so that a direct-current output voltage of the pair of the differential output terminals (Q, Qb) is constant. Accordingly, the direct-current output voltage which is a voltage obtained by averaging output voltages of the non-inverted signal output terminal Q and the inverted signal output terminal Qb that include the pair of differential output terminals (Q, Qb) can be maintained to be constant, irrespective of the magnitude of the current that is flown through the current source circuit. With this arrangement, the magnitude of the current that is flown through the current source circuit can be varied in a wide range, according to an operation speed required for the differential logic circuit.

Preferably, the differential logic unit 410 in the differential logic circuit in the exemplary embodiment, as shown in FIG. 6 as an example, includes a differential pair 110 which is connected to the pair of differential signal output terminals (Q, Qb) and receives a plurality of the logic signals (D, Db) as data signals, a holding unit 120 that holds states of the differential signal output terminals (Q, Qb), and a switch circuit 140 which receives a pair of the differential logic signals (Ck, Ckb) as differential clock signals, and selectively connects the differential pair 110 or the holding unit 120 to the current source circuit 130, based on the differential clock signals (Ck, Ckb). Preferably, the differential logic circuit functions as a data latch.

Preferably, when the pair of the differential logic signals (Ck, Ckb) that are received as the differential clock signals are set to a first pair of differential logic signals, a second pair of differential logic signals (D, Db) are supplied to the differential pair 110 as the data signals.

Figure 16:
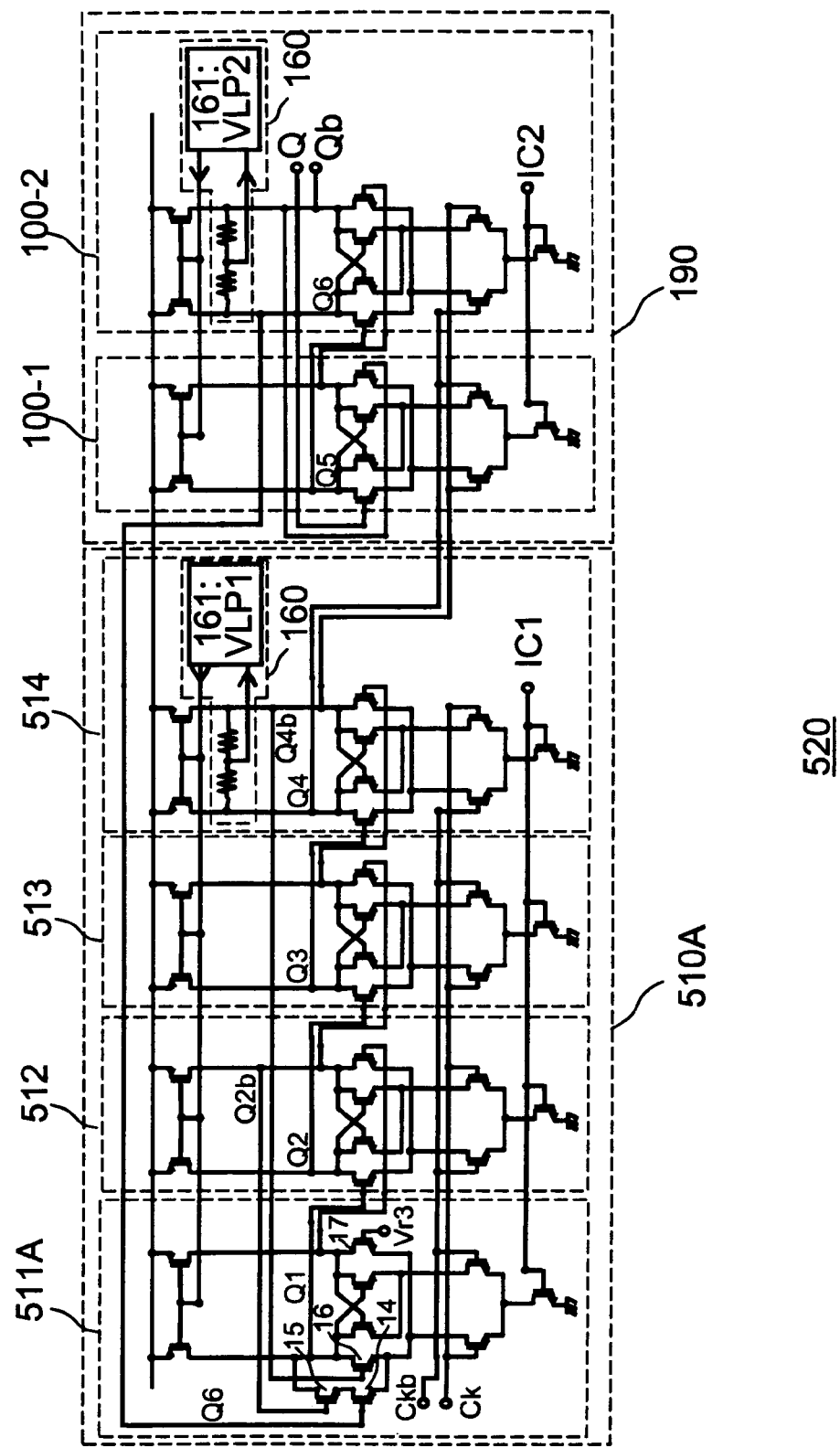
FIG. 16 is a circuit block diagram of a ⅟₇ frequency divider in a seventh example.

Preferably, as shown by the differential latch circuit 511A in FIG. 15 and the differential latch circuit 511A in FIG. 16 as an example, one of the differential pair is formed of a plurality of transistors (11, 12 in FIGS. 15, 14 to 16 in FIG. 16) that respectively receive the plurality of the logic signals, and the other of the differential pair is formed of a transistor (13 in FIG. 15, 17 in FIG. 16) which receives a comparison reference voltage signal, and the differential logic circuit functions as a data latch with a combinatorial logic operation function which outputs a result of a combinatorial logic operation using the plurality of the logic signals from the differential signal output terminals.

Figure 7:
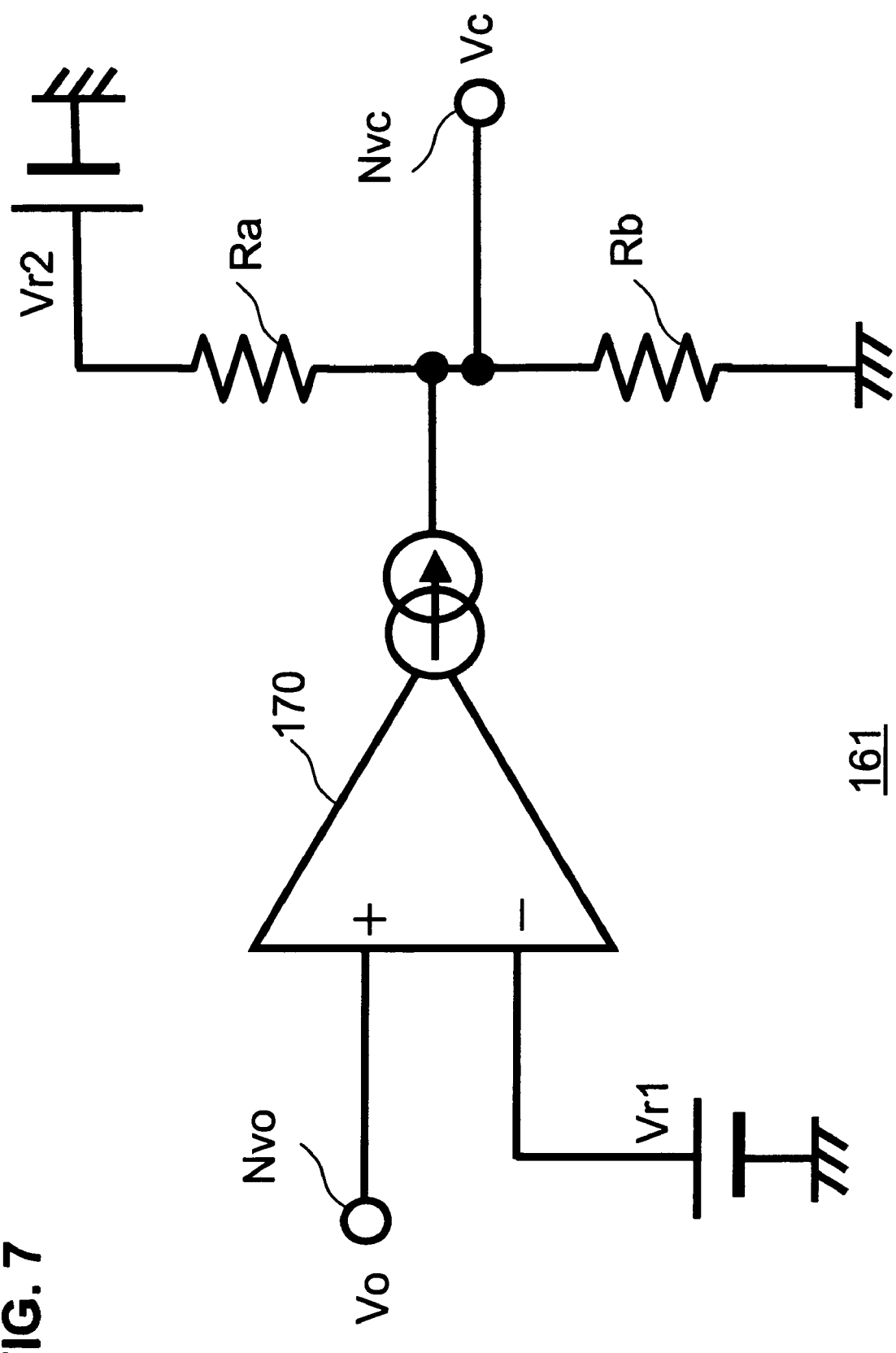
FIG. 7 is a circuit block diagram of a constant voltage control loop in the first example.
Figure 10:
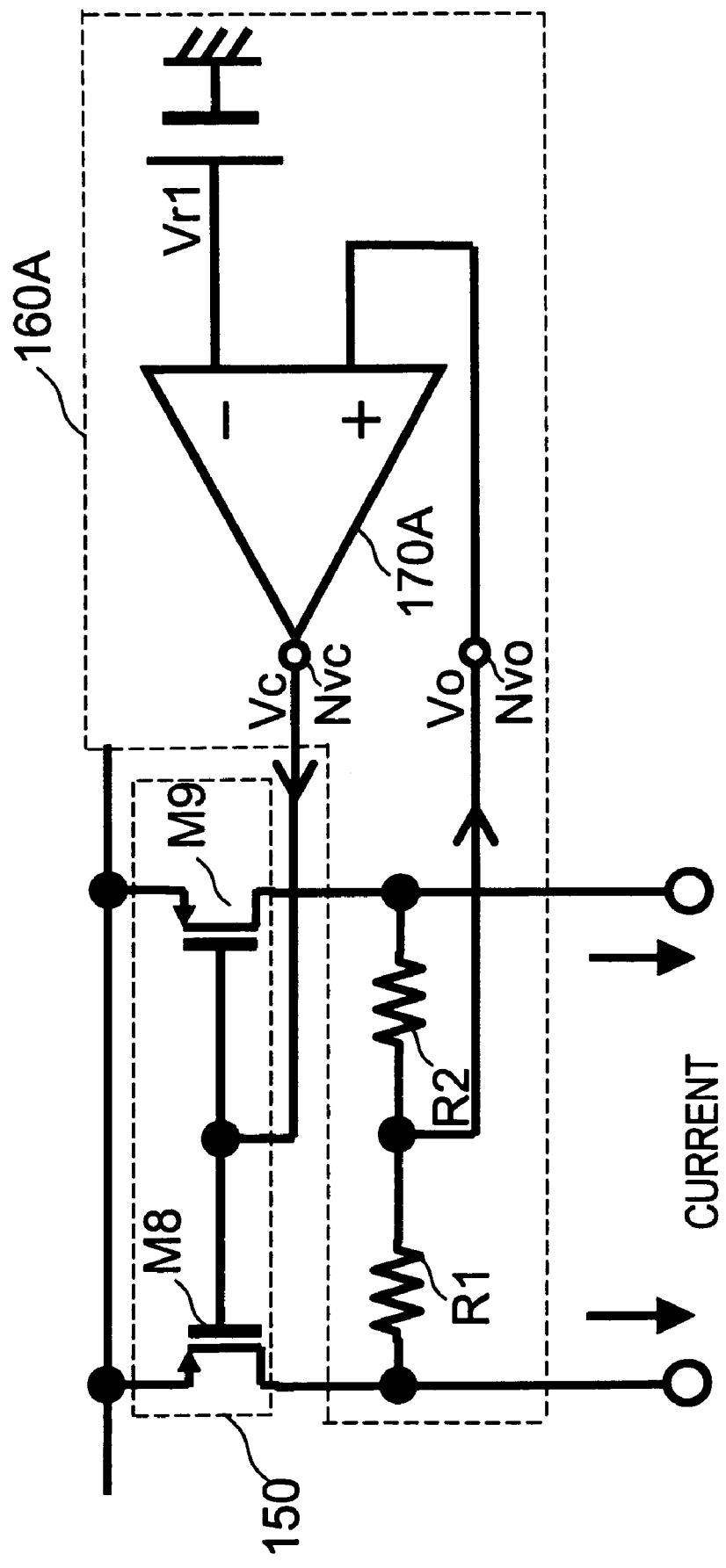
FIG. 10 is a circuit block diagram of a load control circuit in a second example.

Preferably, as shown in FIGS. 6, 7, and 10 as an example, the load circuit 150 includes an active load circuit (M8, M9) connected between a power supply VDD and the pair of differential signal output terminals (Q, Qb), the load control circuit 160 includes a differential amplifier circuit (170, 170A) which receives a voltage Nvo intermediate between voltages of the pair of differential signal output terminals (Q, Qb) at a first differential input terminal Nvo thereof and receives a reference voltage signal Vr1 at a second differential input terminal thereof, and the differential amplifier circuit (170, 170A) controls the active load circuit (M8, M9) based on a potential difference between the intermediate voltage Nvo and a reference voltage Vr1.

Preferably, the load control circuit 160 includes a first resistance R1 and a second resistance R2 having equal resistance values connected in series between the pair of differential signal output terminals (Q, Qb) and have equal resistance values, and a voltage at a connecting point Nvo between the first resistance R1 and the second resistance R2 is supplied to the first differential input terminal as the intermediate voltage. With the above-mentioned arrangement, the direct-current output voltage obtained by adding the output voltage of the non-inverted signal output terminal Q and the output voltage of the inverted signal output terminal Qb and halving a resulting voltage is supplied to the differential amplifier circuit (170, 170A). The differential amplifier circuit (170, 170A) can also control the load of the load circuit 150 so that this direct-current output voltage is maintained to be constant. The resistance values of the resistances R1 and R2 should be equal, and the resistance value may be large in such an extent that the load of the load circuit 150 is not affected. The magnitude of the resistance value can be determined, as necessary.

Preferably, as shown in FIG. 7 as an example, the differential amplifier circuit 170 is a current output type differential amplifier circuit, an output terminal of the current output type differential amplifier circuit 170 is connected to a control terminal Nvc of the active load circuit, and the differential amplifier circuit 170 further includes a third resistance Ra connected between a second reference voltage Vr2 and the control terminal Nvc and a fourth resistance Rb connected between the control terminal Nvc and the ground, when the reference voltage Vr1 is set to a first reference voltage Vr1. That is, the differential amplifier circuit 170 may be a so-called OTA (Operational Transconductance Amplifier) that converts a potential difference into a current.

Preferably, as shown in FIG. 10 as an example, a voltage output terminal of the differential amplifier circuit 170A is connected to a control terminal of the active load circuit 150. That is, the differential amplifier circuit 170A may be a common operational amplifier (op amp) circuit of a voltage output type which outputs from a voltage output terminal thereof a voltage, based on a potential difference between input terminals thereof.

Preferably, as shown in FIG. 13 as an example, the differential logic unit 410A is formed by combining a plurality of differential pairs each of which receives the signals (D-1 and D-1b, D-2 and D-2b) that are mutually different differential signals.

Figure 11:
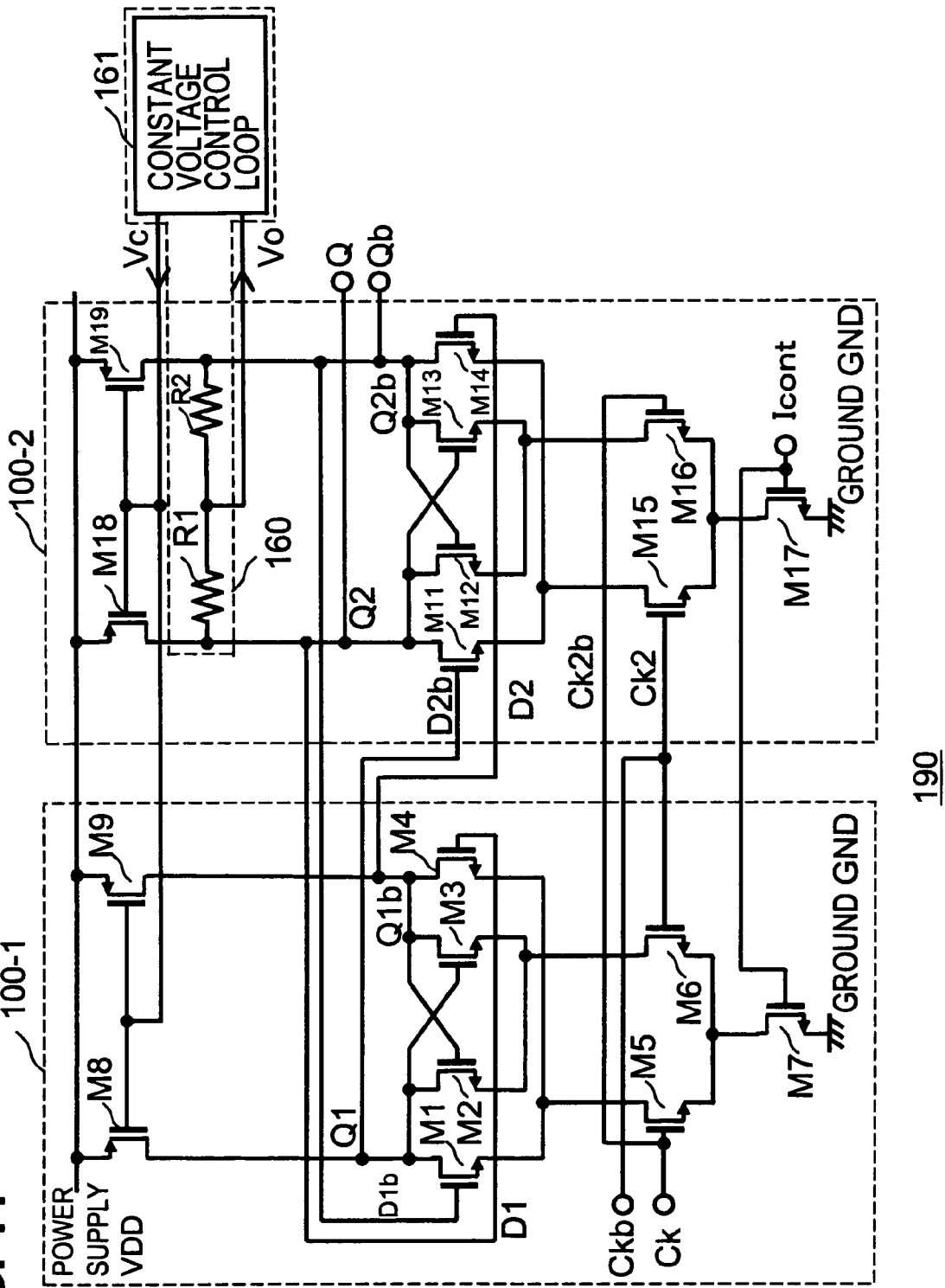
FIG. 11 is a circuit block diagram of a ½ frequency divider in a third example.

In a frequency divider according to an exemplary embodiment of the present invention, as shown in FIG. 11 as an example, differential latch circuits (100-1, 100-2), which are a plurality of the differential logic circuits, are cascaded so that output signals of the differential signal output terminals (Q1, Q1b) in a preceding stage are supplied as the logic signals (D2b, D2) in a subsequent stage, and output signals of the differential signal output terminals (Q2, Q2b) in one of subsequent stages are supplied as the logic signals (D1b, D1) in an initial stage. The differential clock signals (Ck, Ckb) are supplied in common to the cascaded differential latch circuits, and frequency division is performed in synchronization with the differential clock signals.

Preferably, as shown in FIG. 11 and FIGS. 14 to 16 as an example, the load control circuit 160 is provided in common to the plurality of the differential latch circuits (100-1, 100-2; 501 to 504; 511, 512 to 514 or the like).

Preferably, as shown in FIG. 11 as an example, a frequency divider according to an exemplary embodiment of the present invention includes the first differential latch circuit 100-1 and the second differential latch circuit 100-2. Preferably, phases of the clock signals (Ck, Ckb) are inverted between the first differential latch circuit 100-1 and the second differential latch circuit 100-2, and the clock signals are connected in common, the pair of differential output terminals of the first differential latch circuit 100-1 are connected to a pair of differential signal input terminals (D2, D2b) of the second differential latch circuit 100-2, the pair of differential output terminals (Q, Qb) of the second differential latch circuit 100-2 are connected to a pair of differential signal input terminals (D1, D1b) of the first differential latch circuit, and the load control circuit 160 is provided in common to the first differential latch circuit 100-1 and the second differential latch circuit 100-2.

Figure 17:
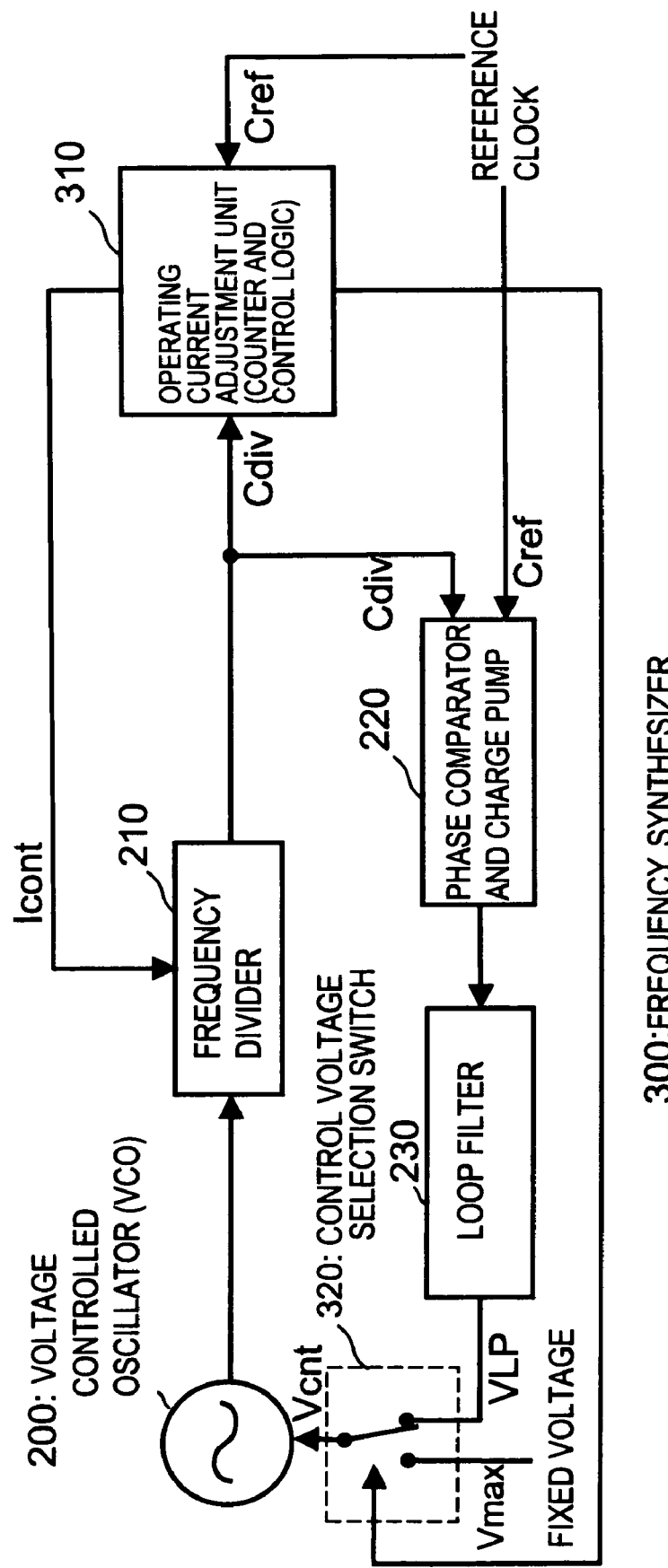
FIG. 17 is a block diagram of a frequency synthesizer in an eighth example.

As shown in FIG. 17 as an example, a frequency synthesizer 300 according to an exemplary embodiment of the present invention includes a voltage controlled oscillator 200, a frequency divider 210 which frequency-divides an output signal of the voltage controlled oscillator, and a phase comparator 220 which compares the phase of a frequency-divided clock signal Cdiv obtained by frequency division by the frequency divider 210 with the phase of a reference clock signal Cref. The frequency synthesizer 300 controls a voltage Vcnt of the voltage controlled oscillator 200 to cause the voltage controlled oscillator 200 to oscillate at a desired frequency, based on a difference between the phases compared by the phase comparator 220. The frequency divider 210 includes the differential logic circuit (100, 190, or 400). The frequency synthesizer 300 further includes a control voltage selection switch 320 and an operating current adjustment unit 310. The control voltage selection switch 320 makes selection between supply of a voltage signal VLP on the basis of the difference between the phases compared by the phase comparator 220 and supply of a fixed voltage signal Vmax by which an oscillation frequency of the voltage controlled oscillator 200 becomes maximum, as a signal for controlling the oscillation frequency of the voltage controlled oscillator. The operating current adjustment unit 310 causes the control voltage selection switch 320 to select the fixed voltage signal Vmax to cause the voltage controlled oscillator 200 to oscillate at the maximum oscillation frequency, and evaluates a frequency of the frequency-divided clock signal Cdiv while varying the magnitude of current that is flown through the current source circuit 130 included in the differential logic circuit (100, 190, or 400). Then, based on a result of the evaluation, the operating current adjustment unit 310 determines the magnitude of the current that is flown through the current source circuit 130 when the operating current adjustment unit causes the control voltage selection switch 320 to select the voltage signal VLP on the basis of the difference between the phases compared by the phase comparator 220.

The overview of the exemplary embodiment is summarized as described above. More specific examples of the present invention will be described in detail with reference to drawings.

First Exemplary Embodiment

FIG. 6 is a circuit block diagram of a differential latch circuit 100, which is a differential logic circuit according to a first example. The differential logic circuit includes a current source circuit 130 that supplies a power supply to the differential logic circuit, a differential logic unit 410 that implements a desired differential logic, a load circuit 150, and a load control circuit 160.

The current source circuit 130 includes an N-channel MOS transistor M7 with a gate thereof connected to a current control terminal and a source thereof connected to the ground GND, and supplies a power supply current (operating current) of the differential logic unit 410. It is arranged that the operating current output from a drain of the N-channel MOS transistor M7 can be controlled by a voltage of a current control signal Icont received from the current control terminal.

A circuit that implements logic of the differential latch circuit 100 is provided at the differential logic unit 410. Inside the differential logic unit 410, a differential pair 110, a holding unit 120, and a switch circuit 140 are provided. The differential pair 110 is connected to a pair of differential signal input terminals (D, Db) and a pair of differential output terminals (Q, Qb). When a non-inverted clock signal Ck is high and an inverted clock signal Ckb is low, the differential pair 110 drives the differential output terminals (Q, Qb) based on signals received from the differential signal input terminals (D, Db). The differential pair 110 includes an N-channel MOS transistor M1 with a drain thereof connected to the non-inverted signal output terminal Q and a gate thereof connected to the inverted signal input terminal Db, and an N-channel MOS transistor M4 with a source thereof connected in common to a source of the N-channel MOS transistor M1, a drain thereof connected to the inverted signal output terminal Qb, and a gate thereof connected to the non-inverted signal input terminal D.

The holding unit 120 includes an N-channel MOS transistor M2 with a gate thereof connected to the inverted signal output terminal Qb and a drain thereof connected to the non-inverted signal output terminal Q, and an N-channel MOS transistor M3 with a source thereof connected in common to a source of the N-channel MOS transistor M2, a gate thereof connected to the non-inverted signal output terminal Q, and a drain thereof connected to the inverted signal output terminal Qb. The holding unit 120 holds logic levels of the differential output terminals (Q, Qb) when the inverted clock signal Ckb is high and the non-inverted clock signal Ck is low.

The switch circuit 140 includes an N-channel MOS transistor M5 with a source thereof connected to the drain of the N-channel MOS transistor M7 in the current source circuit 130 and a drain thereof connected to the sources of the N-channel MOS transistors M1 and M4 of the differential pair 110 connected in common and an N-channel MOS transistor M6 with a source thereof connected to the drain of the N-channel MOS transistor M7 of the current source circuit 130 and a drain thereof connected to the sources of the N-channel MOS transistors M2 and M3 of the holding unit 120 connected in common. The non-inverted clock signal Ck is connected to a gate of the N-channel MOS transistor M5. The inverted clock signal Ckb is connected to a gate of the N-channel MOS transistor M6.

When the clock signal Ck is high and the clock signal Ckb is low, the switch circuit 140 supplies to the differential pair 110 the current supplied from the current source circuit 130. When the clock signal Ckb is high and the clock signal Ck is low, the switch current 140 supplies to the holding unit 120 the current supplied from the current source circuit 130. That is, the switch circuit supplies the current supplied from the current source circuit to one of the differential pair 110 or the holding unit 120 according to the logic levels of the clock signals.

These differential pair 110, the holding unit 120, and the switch circuit 140 implement the logic of the differential latch circuit 100 in which when the clock signal Ck is high and the clock signal Ckb is low, data received from the differential input terminals D and Db are output from the differential signal output terminals Q and Qb, and when the clock signal Ck is low and the clock signal Ckb is high, the logic levels of the differential signal output terminals Q and Qb are held. By changing the configuration of this differential logic unit 410, various differential logic circuits can be configured.

The load circuit 150 includes a P-channel MOS transistor M8 with a source thereof connected to a power supply VDD and a drain thereof connected to the non-inverted signal output terminal Q and a P-channel MOS transistor M9 with a source thereof connected to the power supply VDD and a drain thereof connected to the inverted signal output terminal Qb.

The load control circuit 160 includes a first resistance R1 and a second resistance R2 connected in series between the non-inverted signal output terminal Q and the inverted signal output terminal Qb, and a constant voltage control loop 161. The first resistance R1 and the second resistance R2 have mutually equal resistance values, and a voltage that is just intermediate between an output voltage of the non-inverted signal output terminal Q and an output voltage of the inverted signal output terminal Qb, or a direct-current output voltage of the differential logic circuit (differential latch circuit) 100 is obtained at a connecting point Nvo between the first resistance R1 and the second resistance R2.

This connecting point Nvo is connected to an input terminal of the constant voltage control loop 161, as a direct-current output voltage detection node of the differential logic circuit 100. An output terminal of the constant voltage control loop 161 is connected to a voltage control node Nvc of the load circuit 150. The constant voltage control loop 161 controls a voltage at the voltage control node Nvc of the load circuit 150 such that the direct-current output voltage of the differential logic circuit (differential latch circuit) 100 is constant irrespective of the magnitude of the current that flows through the current source circuit 130, based on the voltage at the direct-current output voltage detection node Nvo.

FIG. 7 is a circuit block diagram showing an internal configuration of the constant voltage control loop 161. A differential amplifier circuit 170 is a current output type differential amplifier circuit. A non-inverted signal input terminal of the current output type differential amplifier circuit 170 is connected to the direct-current output voltage detection node Nvo, an inverted signal input terminal of the current output type differential amplifier circuit 170 is connected to a first reference voltage Vr1, and a current output terminal is connected to the voltage control node Nvc. The current output type differential amplifier circuit 170 outputs current that is proportional to a potential difference between the non-inverted signal input terminal and the inverted signal input terminal, from the current output terminal. This current output type differential amplifier circuit 170 is a so-called OTA (Operational Transconductance Amplifier). The constant voltage control loop 161 further includes a resistance Ra connected between a second reference voltage Vr2 and the voltage control node Nvc and a resistance Rb connected between the voltage control node Nvc and a ground potential GND.

The load control circuit 160 performs control so that the direct-current output voltage (voltage at the node Nvo) of the differential signal output terminals Q and Qb of the differential latch circuit is constant irrespective of the current that is flown through the current source circuit 130, based on the first reference voltage Vr1, the second reference voltage Vr2, and resistance values of the resistances Ra and Rb. That is, when a voltage Vo at the direct-current output voltage detection node Nvo rises to be larger than the first reference voltage Vr1, the current output type differential amplifier circuit 170 outputs the current from the current output terminal. The load control circuit 160 performs control so that, with this arrangement, a voltage Vc at the voltage control node Nvc is raised to make it difficult for current to flow through each of the transistors M8 and M9 constituting an active load of the load circuit 150, thereby increasing an equivalent resistance of the active load to reduce the voltage Vo at the direct-current output voltage detection node Nvo. On the other hand, when the voltage Vo received from the direct-current output voltage detection node Nvo falls to be lower than the first reference voltage Vr1, the current output type differential amplifier circuit 170 sucks the current from the current output terminal. The load control circuit 160 performs control so that, with this arrangement, the voltage Vc output from the voltage control node Nvc is lowered to facilitate the current to flow through each of the transistors M8 and M9 constituting the active load of the load circuit 150, thereby reducing the equivalent resistance of the active load to raise the voltage Vo at the direct-current output voltage detection node Nvo. That is, the load control circuit 160 functions as a constant voltage control loop that keeps the direct-current output voltage of the differential logic circuit (differential latch circuit) 100 to be constant.

Figure 8:
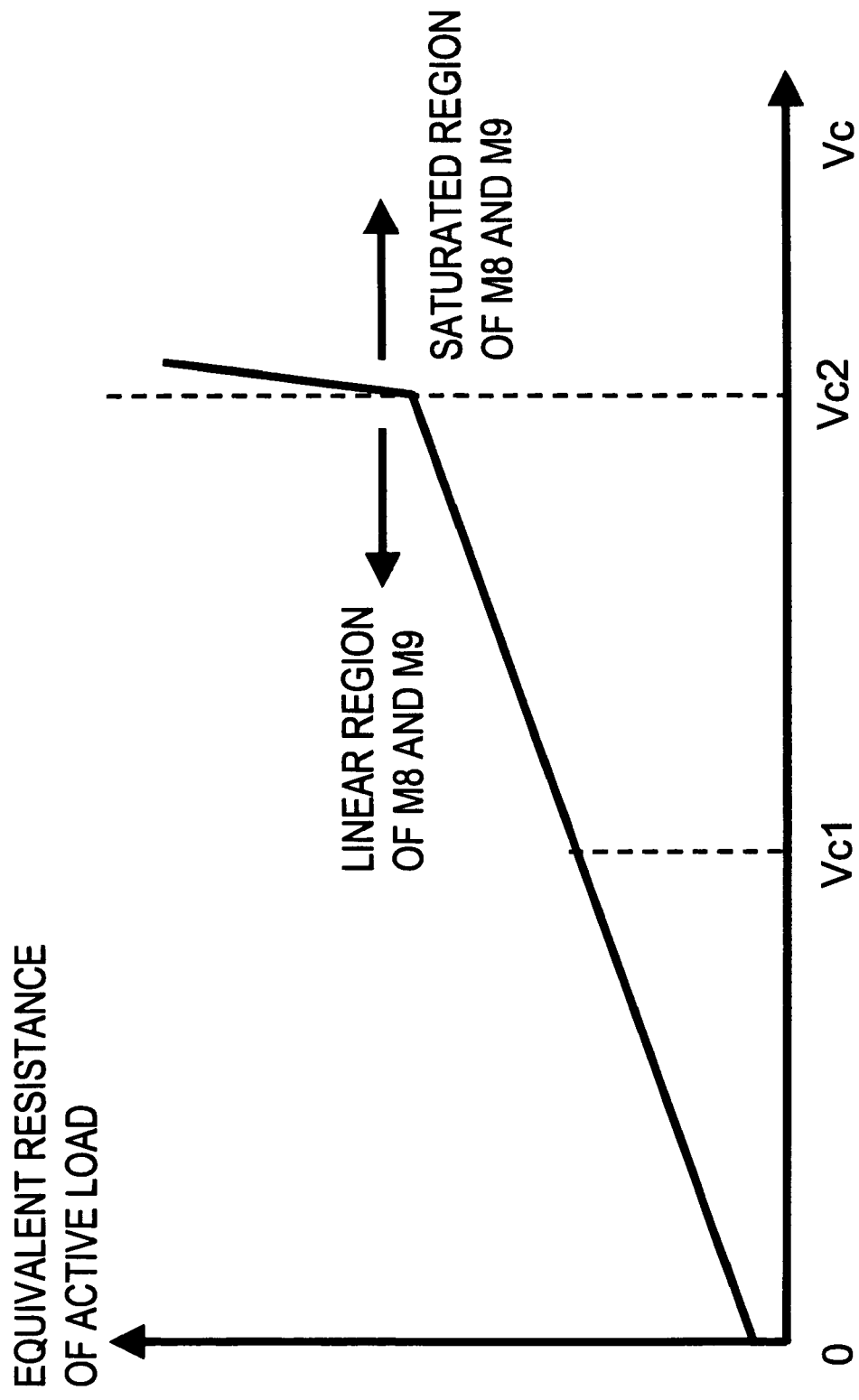
FIG. 8 is a graph showing a relationship between a control voltage and an equivalent resistance of an active load.

FIG. 8 is a graph showing a relationship between the control voltage Vc and the equivalent resistance of each of the active loads (M8, M9) in the first example. The relationship between the control voltage Vc and the equivalent resistance of each of the active loads constituted from the P-channel MOS transistors M8 and M9 in the differential latch circuit 100 is as follows. That is, when the control voltage Vc is equal to or less than a voltage Vc2, the active load constituted from each of the transistors M8 and M9 is in a linear region. Thus, each of the active loads (M8, M9) has a characteristic in which, as the control voltage Vc increases, the equivalent resistance monotonously increases. That is, when the transistors M8 and M9 operate in the linear region, the absolute value of the equivalent resistance of the active load is small, and a variation in the absolute value of the equivalent resistance is gentle. The equivalent resistance can be varied in a range from several hundred Ω to several thousand Ω, depending on the gate length and the gate width of each transistor. On the other hand, when the control voltage is equal to or higher than the voltage Vc2, the transistors M8 and M9 operate in a saturated region. Thus, the absolute value of the equivalent resistance of each active load increases to several hundred kilo Ω, and a variation rate of the equivalent resistance is also large. The present invention uses this equivalent resistance variation characteristic. By performing control so that a voltage drop between the source and the drain of each of the transistors M8 and M9 of the active load is constant, a maximum toggle frequency variable range of the differential latch circuit can be widened.

An operation of controlling the direct-current output voltage Vo of the differential latch circuit to be constant will be described in more detail. In an initial state, a supply voltage VDD is applied to the differential latch circuit 100, and the current control signal Icont connected to the current source circuit 130, the clock signals (Ck, Ckb), and data signals (D, Db) are not applied to the differential latch circuit. All of the transistors M1 to M7 are shut off. In that case, each of drain voltages of the transistors M8 and M9 assumes the same as the supply voltage VDD due to the presence of dark current. Thus, the voltage Vo at the output voltage input terminal assumes the same voltage as the supply voltage VDD. When the load control circuit 160 operates in that state, the current output type differential amplifier circuit 170 flows source current from the output terminal because the voltage Vo at the output voltage input terminal is larger than the first reference voltage Vr1. A voltage close to the second reference voltage Vr2 is output from a control voltage output terminal, and is applied to gates of the transistors M8 and M9 of the active load as the control voltage Vc. The differential latch circuit 100 thereby assumes a standby state.

Next, when the clock signals (Ck, Ckb) and the data signals (D, Db) are applied to the differential latch circuit 100 and a constant voltage is applied to the current control terminal (gate of the transistor M7), a constant current is to flow through the drain of the transistor M7. This current is supplied from the drains of the transistors M8 and M9 of the active load through the differential pair 110 or the holding unit 120. Accordingly, direct-current voltage levels of the output terminals (Q, Qb) of the differential latch circuit 100 abruptly fall. The voltage Vo at the output voltage input terminal also abruptly falls to be smaller than the first reference voltage Vr1 of the load control circuit 160.

Then, since the non-inverted signal input terminal voltage Vo of the current output type differential amplifier circuit 170 is smaller than the inverted signal input terminal voltage Vr1, an output current becomes a sink current, and the voltage Vc at the control voltage output terminal is reduced. Accordingly, the equivalent resistance of the active load constituted from the transistors M8 and M9 is reduced, so that the current that flows through the source to the drain of each of the transistors M8 and M9 increases. Thus, the direct-current output voltage level of the differential latch circuit 100 increases, and the voltage Vo also increases.

When the voltage Vo at the output voltage input terminal becomes the same as the first reference voltage Vr1, the output current of the current output type differential amplifier circuit 170 does not flow. The control voltage Vc becomes equivalent to a voltage value obtained by voltage division of the second reference voltage using the resistances Ra and Rb. The control voltage Vc therefore matches the control target value of the constant voltage control loop, so that the control loop converges. When the control voltage Vo becomes larger than the first reference voltage Vr1 for some reason, the control voltage Vc increases due to the operation of the current output type differential amplifier circuit 170, the equivalent resistance of the active load increases, drops in source-to-drain voltages of the transistors M8 and M9 increase, so that the control voltage Vo is reduced. On the contrary, when the control voltage Vo becomes smaller than the first reference voltage Vr1 for some reason, the control voltage Vc is reduced due to the operation of the current output type differential amplifier circuit 170, the equivalent resistance of the active load is reduced, drops in the source-to-drain voltages of the transistors M8 and M9 are reduced, so that the control voltage Vo increases. That is, due to the operation of the constant voltage control loop of the load control circuit 160, the control voltage Vo is controlled to be kept at the constant voltage equal to the first reference voltage Vr1.

Figure 9:
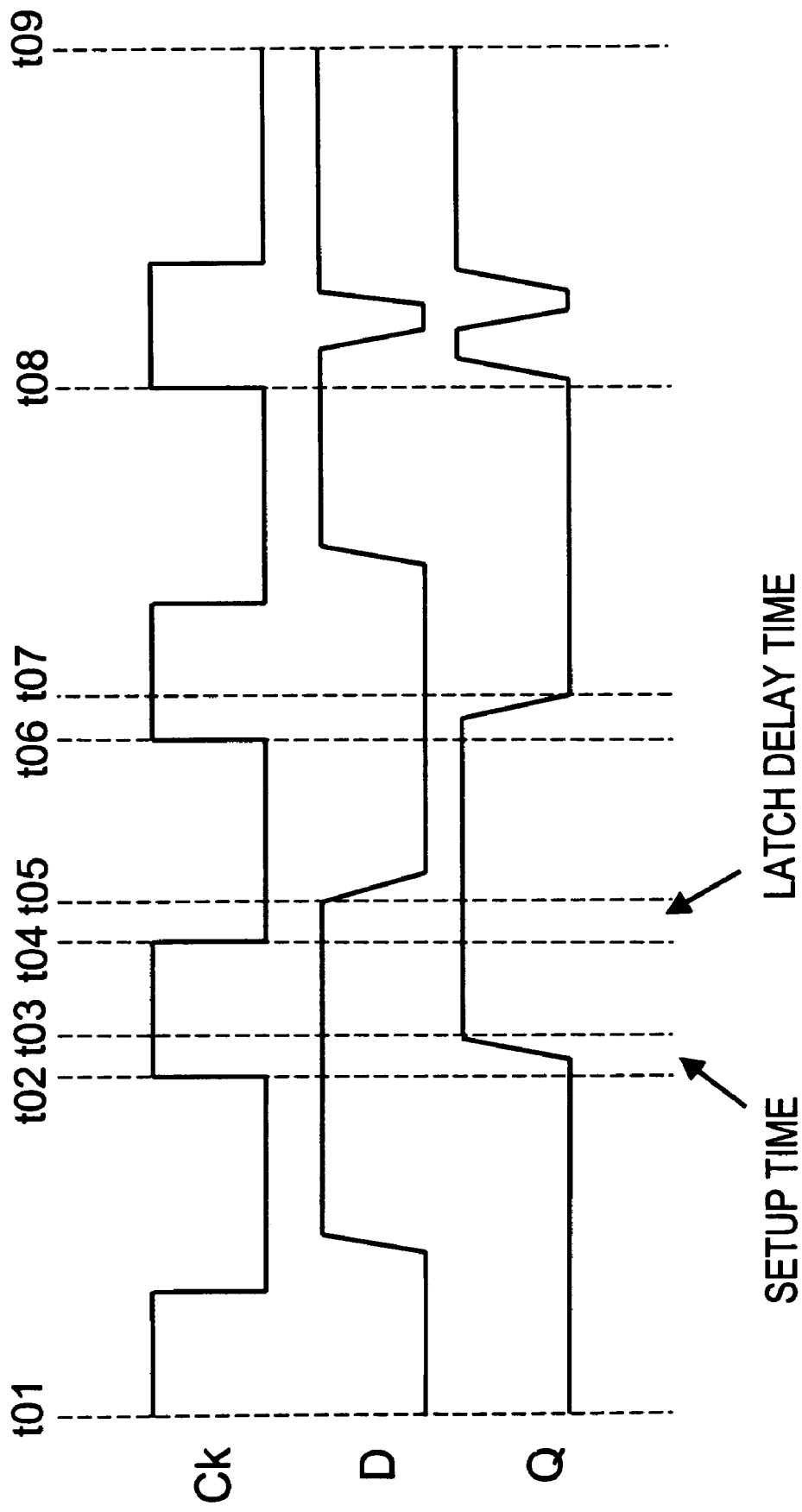
FIG. 9 is an operation timing diagram of the differential latch circuit in the first example.

When the control voltage Vo is controlled to be constant, and the constant current flows through the current source circuit 130, the differential latch circuit 100 performs a setup operation and a latch operation according to the data signals (D, Db) and the clock signals (Ck, Ckb) that are applied. This operation will be described, using an operation timing diagram of the differential latch circuit in FIG. 9. Referring to FIG. 9, only the non-inverted clock signal Ck, the non-inverting data input terminal D, and the non-inverting data output terminal Q are shown. It is assumed that the signals of logic levels opposite to those of the non-inverted signals are respectively supplied to and output from the inverted clock signal Ckb, the inverting data input terminal Db, and the inverting data output terminal Qb. To take an example, when the non-inverted signal is high, the inverted signal is low. When the non-inverted signal is low, the inverted signal is high.

When the clock signal Ck is high in the differential latch circuit 100, the signal received from the data input terminal D is output from the data output terminal Q without alteration. On the other hand, when the clock signal Ck goes low, the differential latch circuit 100 maintains the logic level at the data output terminal Q immediately before the clock signal Ck goes low. When a logic level at the data input terminal D is changed in a period where the clock signal Ck is low, the logic level at the data input terminal D is output from the data output terminal Q, being delayed just by a setup time after the clock signal Ck has subsequently risen from low to high.

Figure 4:
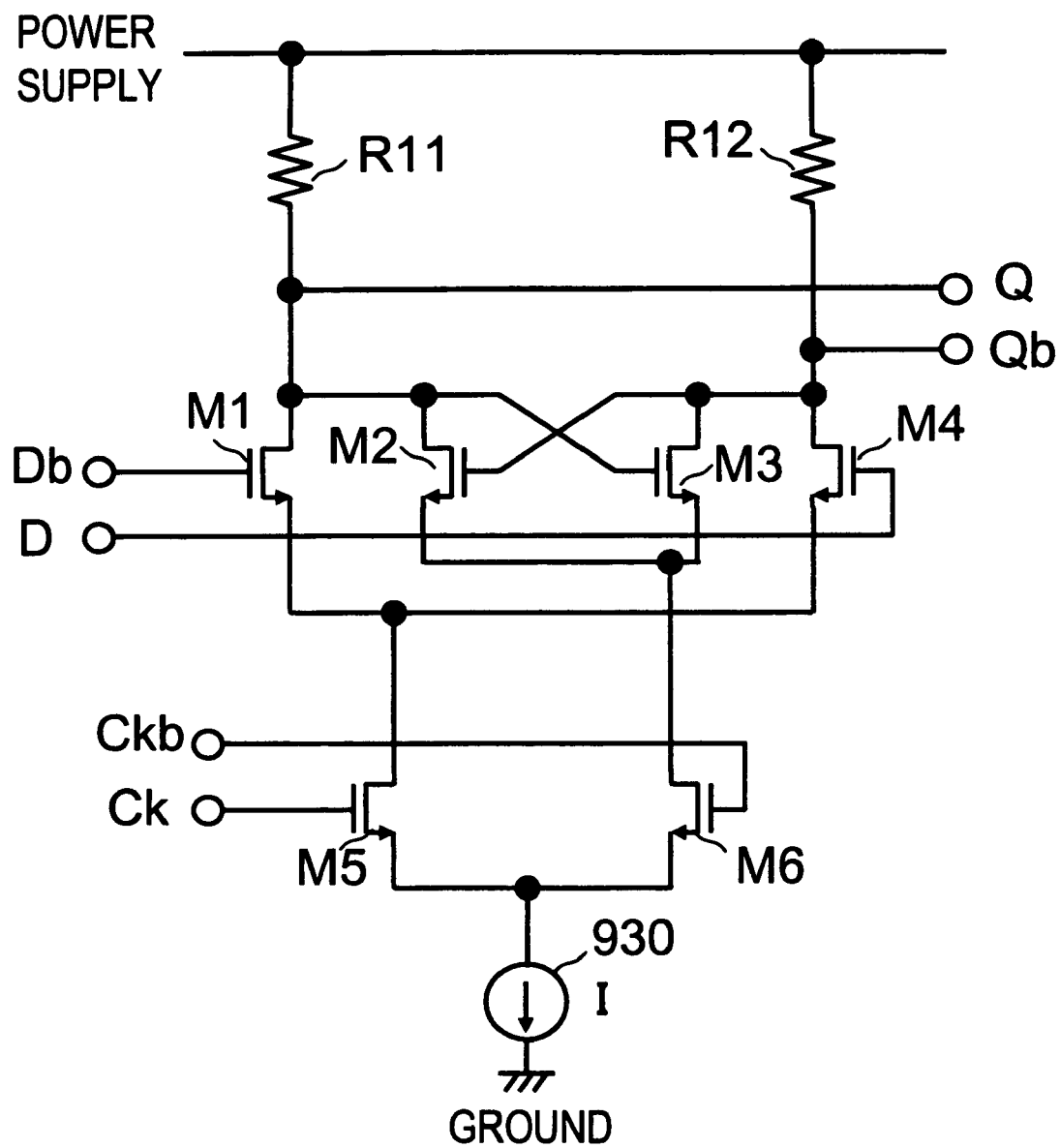
FIG. 4 is a circuit block diagram of a traditional differential latch circuit.
Figure 5:
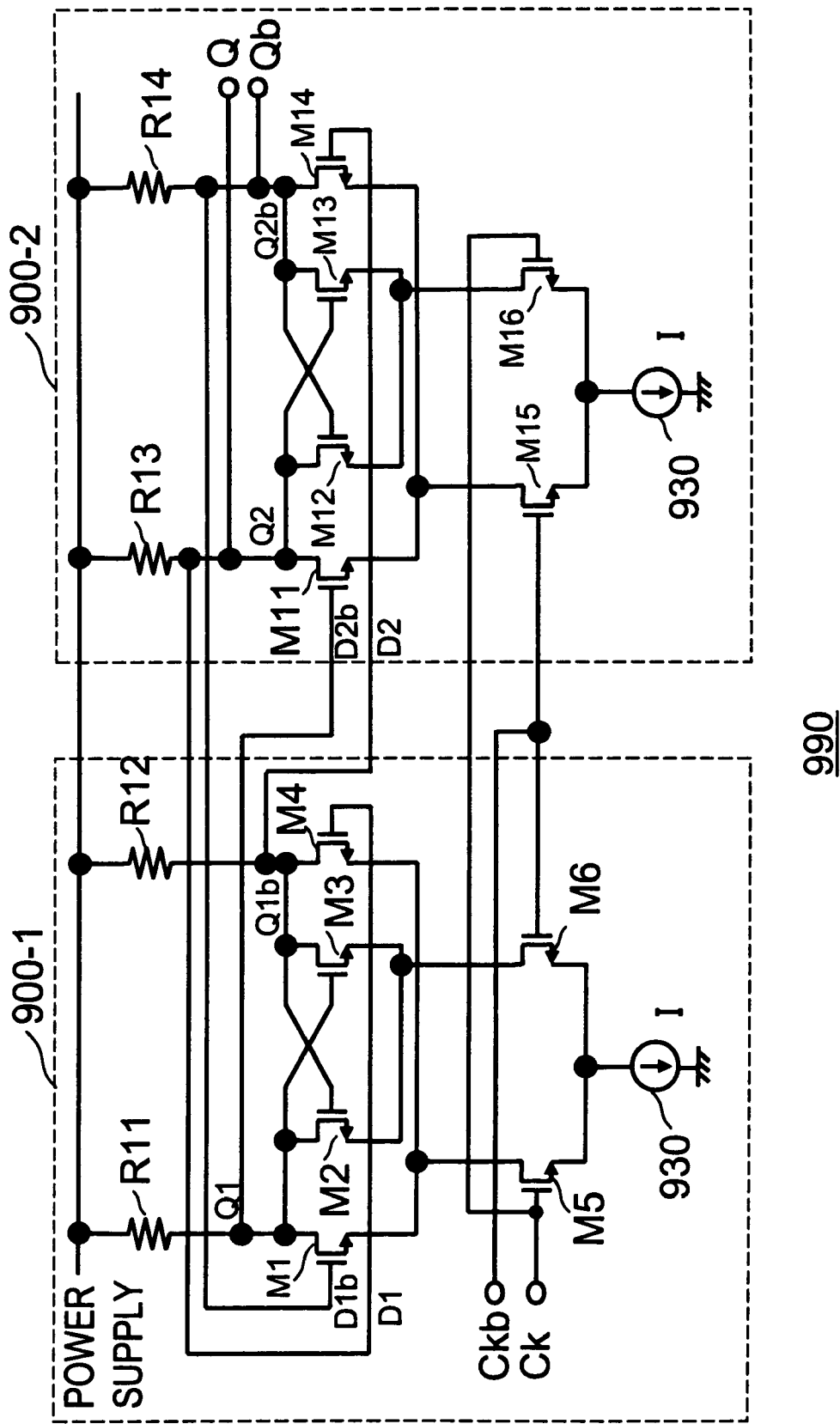
FIG. 5 is a circuit block diagram of a ½ frequency divider using traditional differential latch circuits.

When data D received from the data input terminal changes at a falling edge of the clock signal Ck in a case where the differential latch circuit 100 is used as a frequency divider or the like, a period of time taken from a fall of the clock signal Ck (at a timing t04 in FIG. 9) to a transition in the input data D (at a timing t05) poses a problem. In a related art differential latch circuit 900 shown in FIGS. 4 and 5, with respect to control of both of a setup time and a latch delay time, a fall speed (inclination) at each of data output terminals Q and Qb, and data input terminals can be controlled by an amount of current that is flow through a current source. A rise speed (inclination) at each of the data output terminals and the data input terminals is limited by the value of a corresponding one of load resistances R11 and R12 and cannot be freely varied. On contrast therewith, when the current that is flown through the current source circuit 130 is increased to increase operating current of the differential latch circuit, an equivalent resistance of the load circuit 150 is reduced with the increase of the operating current, in the differential latch circuit 100 in the first example shown in FIG. 6. Accordingly, when the current that is flown through the current source circuit 130 is increased to increase the operating current of the differential latch circuit, the inclination of a rise as well as the inclination of a fall at the data output terminal Q shown in FIG. 9 can be both sharpened. The setup time can be thereby reduced.

The signals at the non-inverting data output terminal Q and the inverting data output terminal Qb in the differential latch circuit 100 are differential signals. Thus, only a direct-current component of the voltage at the connecting end between the first resistance R1 and the second resistance R2 is supplied to the output voltage input terminal as the voltage Vo due to mutual cancellation of alternating components. Accordingly, in both states of the setup operation (at a timing when the differential pair operates) and the latch operation (at a timing when the holding circuit operates) of the differential latch circuit, the constant voltage control loop of the load control circuit 160 operates as described above, so that the direct-current output voltage Vo is controlled to be equal to the first reference voltage Vr1.

Second Exemplary Embodiment

The internal circuit configuration of the load control circuit (constant voltage control loop) in FIG. 7 described in the first example is a most preferable configuration example. The load control circuit is not limited to the configuration in FIG. 7 using the current output type differential amplifier circuit 170. The load control circuit may use a more common voltage output type differential amplifier circuit. FIG. 10 is a circuit block diagram of a load control circuit 160A in a second example. FIG. 10 describes a load circuit 150 as well, in addition to the load control circuit 160A in the second example. Referring to FIG. 10, a voltage output type differential amplifier circuit 170A is a voltage output type operational amplifier circuit in which a potential difference between a signal applied to a non-inverted signal input terminal thereof and a signal applied to an inverted signal input terminal thereof is infinitely amplified to be large and is then output from a voltage output terminal thereof. The non-inverting input terminal of the differential amplifier circuit 170A is connected to an output voltage input terminal of the load control circuit 160A to receive an output voltage Vo of the load circuit. The inverting input terminal is connected to a reference voltage Vr1, and the output terminal is connected to a control voltage output terminal of the load control circuit 160A to output a control voltage Vc. In a differential latch circuit using this load control circuit, the control voltage Vc for gates of active loads M8 and M9 output from the control voltage output terminal can be varied in a wide range from 0V to a supply voltage. Thus, the active loads M8 and M9 can operate even in a saturated operation region as well. Due to dependence on the control voltage of the equivalent resistance of each active load shown in FIG. 8, the equivalent resistance monotonously increases as the control voltage increases even when the active loads M8 and M9 are in the saturated operation region. Accordingly, an operation as the constant voltage control loop and a latch circuit operation when the load control circuit is incorporated into the differential latch circuit are similar to those in the first example.

In the load control circuit 160A in the second example, the differential amplifier circuit can be formed of the voltage output type differential amplifier circuit (operational amplifier circuit, or operational amplifier) that has a simpler circuit configuration than the current output type differential amplifier circuit in the first example. Thus, the circuit can be simplified and can be made compact. Further, in the case of an integrated circuit, the chip size can be reduced, thus leading to cost reduction.

Third Exemplary Embodiment

FIG. 11 is a circuit block diagram of a ½ frequency divider according to a third example. A ½ frequency divider 190 is formed of two differential latch circuits 100-1 and 100-2 in the first example. A load control circuit 160 is provided in common to the two differential latch circuits 100-1 and 100-2. Gates of active loads M8 and M9 in the differential latch circuit 100-1 and gates of active loads M18 and M19 in the differential latch circuit 100-2 are connected in common to a control voltage output terminal of the load control circuit 160, for supply of a control voltage Vc. Resistances R1 and R2 of the load control circuit 160 are connected to output terminals Q and Qb of the differential latch circuit 100-2.

A non-inverted clock signal Ck and an inverted clock signal Ckb supplied from differential clock signal input terminals Ck and Ckb are connected in common to switch circuits (M5 and M6, and M15 and M16) of the differential latch circuits 100-1 and 100-2. The clock signals connected to the differential latch circuit 100-1 respectively have opposite phases to the clock signals connected to the differential latch circuit 100-2. Accordingly, when a differential pair of one of the differential latch circuits 100-1 and 100-2 is connected to a current source circuit, a holding circuit of the other of the differential latch circuits 100-1 and 100-2 is connected to the current source circuit. When a holding circuit of one of the differential latch circuits 100-1 and 100-2 is connected to the current source circuit, a differential pair of the other of the differential latch circuits 100-1 and 100-2 is connected to the current source circuit.

A non-inverted data output node Q1 and an inverted data output node Q1b of the differential latch circuit 100-1 are respectively connected to an inverted data input node D2b and a non-inverted data input node D2 of the differential latch circuit 100-2. A non-inverted data output node Q2 and an inverted data output node Q2b of the differential latch circuit 100-2 are respectively connected to a non-inverted data input node D1 and an inverted data input node D1b of the differential latch circuit 100-1. Further, the non-inverted data output node Q2 and the inverted data output node Q2b of the differential latch circuit 100-2 are respectively connected to a non-inverted data output terminal Q and an inverted data output terminal Qb. With this configuration, the ½ frequency divider functions as a differential ½ frequency divider in which the clock signals received from the differential clock signal input terminals Ck and Ckb are ½ frequency-divided to output data from the non-inverted data output terminal Q and the inverted data output terminal Qb.

These differential latch circuits 100-1 and 100-2 function as a master-slave type T flip-flop circuit. When the clock Ck rises, the differential latch circuit 100-2 on the side of a slave performs a latch operation (holding operation) simultaneously when the differential latch circuit 100-1 on the side of a master performs a setup operation. Conversely, when the clock Ck falls, the differential latch circuit 100-2 on the side of the slave performs the setup operation simultaneously when the differential latch circuit 100-1 on the side of the master performs the latch operation.

Figure 12:
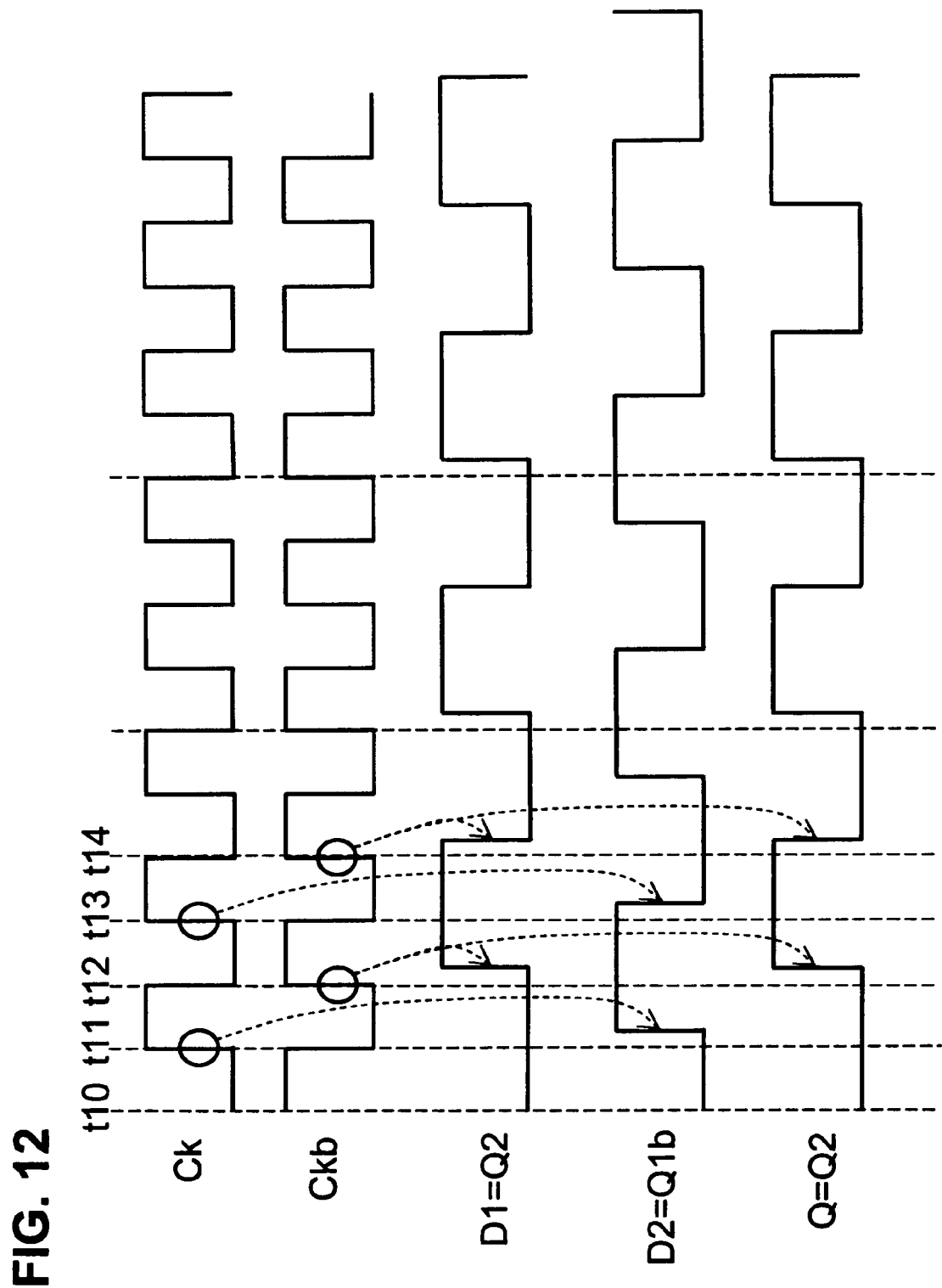
FIG. 12 is an operation timing diagram of the ½ frequency divider in the third example.

FIG. 12 shows an operation timing diagram of the ½ frequency divider in the third example. It is assumed that, at a timing t10 in an initial state, the clock Ck is low, the clock Ckb is high, and the output nodes Q2 and Q1b are both low (output nodes Q2b and Q1 are both high). At a timing t11, the non-inverted data input node D1 on the side of the master is low. Then, when the clock Ck rises at the timing t11, the inverted data output node Q1b on the side of the master or the non-inverted data input node D2 on the side of the slave rises due to the setup operation of the differential latch circuit 100-1 on the side of the master. Then, when the clock Ck falls at a timing t12, the differential latch circuit 100-2 on the side of the slave performs the setup operation while the differential latch circuit 100-1 on the side of the master holds its state. The non-inverted data output node Q2 then rises. Since the output node Q2 is connected to the input node D1, the input node D1 also goes high. Next, when the clock Ck rises at a timing t13, the differential latch circuit 100-1 on the side of the master performs the setup operation. The output node Q1b is then set to be low. When the clock Ck rises at a timing t14, the non-inverted output node Q2 falls. With this arrangement, an output of the frequency divider is fixed at high in one cycle of the input clock Ck, and is then fixed at low in another cycle of the input clock Ck. This operation is repeated. That is, when two cycles of the clock signal Ck are received, one cycle of the signal is output from an output end. Thus, the ½ frequency divider 190 functions as the ½ frequency divider.

A delay time (setup time) taken from a rise of each of the clock signals Ck and Ckb to completion of a rise or fall operation of each of the output nodes (Q1, Q1b, Q2, Q2b) matters in order for this ½ frequency divider to be operated at a maximum speed. A fall delay time of each output node depends on the magnitude of current that is flown through a current source circuit 130. When the magnitude of the current that is flown through the current source circuit 130 is increased, the fall delay time of each node can be shortened. On the other hand, a rise delay time of each output node depends on the magnitude of the equivalent resistance of a load circuit 150. According to this third example, when the magnitude of the current that is flown through the current source circuit 130 is increased to shorten a fall time of each output node, the magnitude of the resistance of each load is also reduced, so that a rise time of each output node is also shortened. That is, when the current that is flown through the current source circuit 130 is increased, not only the fall time of each output node can be shortened, but also the rise time of each output node can be shortened. Accordingly, when the current that is flown through the current source circuit 130 is increased, the ½ frequency divider can be operated at the maximum speed. On the other hand, when it is not necessary to operate the ½ frequency divider at such a high speed, the current that is flown through the current source circuit can be reduced to save power consumption. Since a direct-current output voltage can be held to be constant by the load control circuit 160 even if the current that is flown through the current source circuit is varied. Thus, a logic threshold level of a circuit provided in a subsequent stage of the ½ frequency divider will not be affected.

Referring to FIG. 11, the output nodes (Q2, Q2b) of the differential latch circuit 100-2 are connected to the data output terminals (Q, Qb). Thus, levels at the data output terminals are changed at a fall of the clock signal Ck. However, when the output nodes (Q1, Q1b) of the differential latch circuit 100-1 are connected to the data output terminals (Q, Qb), a ½ frequency divider in which the levels at the data output terminals are changed at a rise of the clock signal Ck can be formed.

Fourth Exemplary Embodiment

FIG. 13 is a circuit block diagram of a differential logic circuit 400 according to a fourth example. The differential logic circuit according to the present invention can be applied to a common differential logic circuit as well as the differential latch circuit and the ½ frequency divider using the differential latch circuits. FIG. 13 shows a two-input NAND circuit having differential inputs and differential outputs. In the differential logic circuit 400, except that the differential logic unit 410 in the first example is replaced by a differential logic unit 410A, configurations of the other circuits are substantially the same as those of the differential latch circuit 100 in the first example. Accordingly, a configuration and an operation of the differential logic unit 410A will be described. The differential logic unit 410A includes four transistors constituted from N-channel MOS transistors M21 to M24. Non-inverted data input terminals (D-1, D-2) and inverted data input terminals (D-1b, D-2b) are connected to the differential logic unit 410A to control turning on and off of the N-channel MOS transistors M21 to M24. A non-inverted data output terminal Q outputs a low level only when both of the non-inverted data input terminals (D-1, D-2) are high, and outputs a high level otherwise. On the other hand, an inverted data output terminal Qb outputs a high level only when inverted data signals D-1b and D2b are both low, or when both of the non-inverted data input terminals (D-1, D-2) are high, and outputs a low level otherwise. That is, the differential logic circuit 400 functions as a differential NAND circuit in which a logic NAND is performed on signals received from the non-inverted data input terminals (D-1, D-2) to respectively output a non-inverted output signal and an inverted output signal of the differential NAND circuit from the non-inverted data output terminal Q and the inverted data output terminal Qb. Since the differential logic circuit in FIG. 13 is differential, as in the first to third examples, the differential logic circuit can perform a logic operation and can output a result of the logic operation at high speed. In particular, the magnitude of current that is flown through a current source circuit can be varied in a wide range. Thus, by controlling the current of the current source circuit according to an operation speed required for the circuit, a high-speed operation and reduction in power consumption can be implemented.

The differential logic circuit 400 in FIG. 13 is the two-input NAND circuit. The circuit in FIG. 13 can be simply changed to a two-input AND circuit, a two-input NOR circuit, or a two-input OR circuit by changing connections of the input and output terminals.

That is, outputs of the NAND circuit and the AND circuit are just inverted. Thus, by exchanging the inverted data output terminal Qb of the two-input NAND circuit by the non-inverted data output terminal Q and exchanging the non-inverted data output terminal Q of the two-input NAND circuit by the inverted data output terminal Qb, the two-input AND circuit is formed.

When the inverted data input terminals (D1b, D2b) are respectively exchanged by the non-inverted data input terminals (D1, D2) and are connected, the two-input NAND circuit in FIG. 13 becomes the two-input NOR circuit.

Further, when the data input terminals are mutually exchanged and the data output terminals are mutually exchanged, the two-input NAND circuit in FIG. 13 becomes the two-input OR circuit. A logic circuit of three inputs or more can also be readily formed into a differential logic circuit.

The differential logic unit (410 or 410A) can form a sequential logic circuit that operates in synchronization with clocks as described in the first example and a combinatorial circuit as described in the fourth example. Thus, by changing the configuration of the differential logic units (410 or 410A), most of logic circuits can be implemented by combining a plurality of the differential logic circuits without changing the basic configurations of the current source circuit 130, the load circuit 150, and the load control circuit 160.

By combining the differential latch circuit and other differential logic circuits described in each of the first to fourth examples, a frequency divider having an arbitrary frequency division ratio can be formed. In that case, in the load control circuit 160, one constant voltage control loop may control gate voltages of the active loads in a unified manner. The load control circuit 160 may be divided into some groups, and one constant voltage control loop circuit may be installed in each group. An optimal operating current can be set according to a frequency frequency-divided by the frequency divider.

Fifth Exemplary Embodiment

Figure 14:
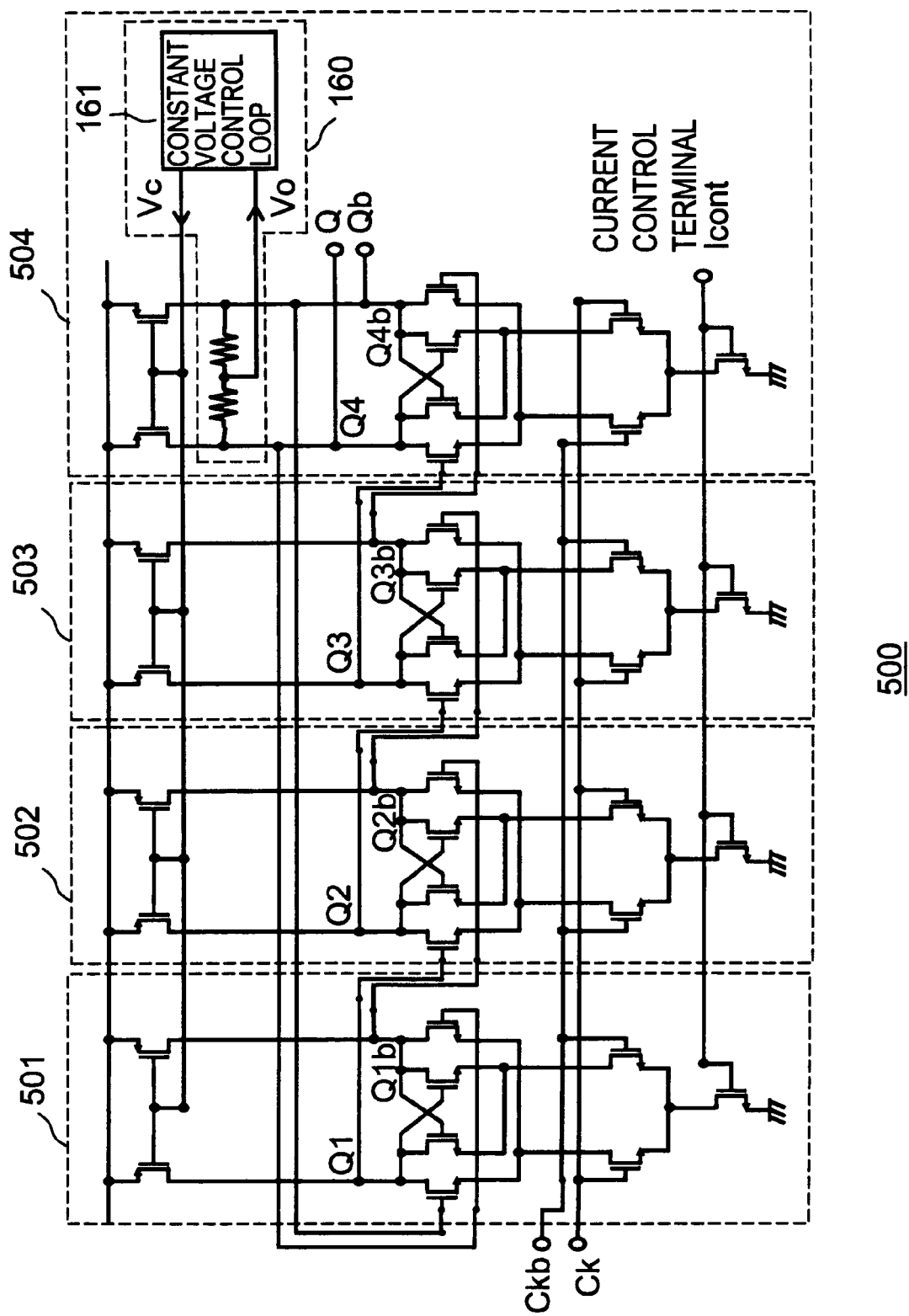
FIG. 14 is a circuit block diagram of a ¼ frequency divider in a fifth example.

FIG. 14 is a circuit block diagram of a ¼ frequency divider 500 in a fifth example. The ¼ frequency divider in FIG. 14 is obtained by cascading differential latch circuits 501 to 504 in the first example. In this ¼ frequency divider, differential signal output terminals (Q1 and Q1b in the differential latch circuit 501, for example) in a preceding stage are connected to differential signal input terminals in a subsequent stage (of the differential latch circuit 502), and different signal output terminals (Q4, Q4b) in a final stage (of the differential latch circuit 504) are connected to initial-stage differential signal input terminals. Clock signals Ck and Ckb in each of the differential latch circuits 501 to 504 are connected in common to each stage so that the phase of each clock signal is inverted between the differential latch circuits in each stage and a stage preceding to each stage. A load control circuit 160 is provided in common to the four differential latch circuits 501 to 504, and the load control circuit 160 is connected to differential signal output terminals (Q, Qb) of the ¼ frequency divider 500. A current control terminal Icont is also connected in common to the respective differential latch circuits 501 to 504. Current that flows through each of the differential latch circuits 501 to 504 is thereby controlled to be equal.

With the above-mentioned configuration, the ¼ frequency divider 500 in FIG. 14 repeats an operation of capturing signals output from the differential latch circuit in a preceding stage in synchronization with a rise and a fall of the clock signals Ck and Ckb and then transmitting the signals to the differential latch circuit in a subsequent stage. With this operation, the ¼ frequency divider 500 functions as a ¼ frequency divider in which the clock signals received from clock signal terminals Ck and Ckb are frequency-divided into clock signals with a cycle of four times that of the clock signals received from the clock terminals Ck and Ckb and are then output from the differential output terminals (Q, Qb).

Sixth Exemplary Embodiment

FIG. 15 is a circuit block diagram of a ⅓ frequency divider 510 in a sixth example. In the ⅓ frequency divider 510 in the sixth example, the differential latch circuit 501 in FIG. 14 is replaced by a differential latch circuit 511 having a combinatorial logic operation function. The other configurations are the same as those of the ¼ frequency divider 500 in the fifth example. One of a differential pair of the differential latch circuit 511 includes NMOS transistors 11 and 12 with sources thereof and drains thereof connected in common. An inverted output signal Q2b of the differential latch circuit 512 is connected to a gate of the NMOS transistor 11, and an inverted output signal Q4b of the differential latch circuit 514 is connected to a gate of the NMOS transistor 12. The other of the differential pair of the differential latch circuit 511 includes an NMOS transistor 13. A comparison reference voltage Vr3 is connected to a gate of the NMOS transistor 13. An intermediate voltage between a high-level output voltage and a low-level output voltage output from each of differential signal output terminals of the differential latch circuits 512 to 514, and 511 is applied to the comparison reference voltage Vr3.

This differential latch circuit 511 functions as an NOR circuit. In this circuit, when the clock signal Ck is high and a high level is applied to one of the gates of the NMOS transistors 11 and 12, a low level is output from a non-inverted signal output terminal Q1, and a high level is output from an inverted signal output terminal Q1b. When a low level is applied to both of the gates of the NMOS transistors 11 and 12, the high level is output from the non-inverted signal output terminal Q1, and the low level is output from the inverted output terminal Q1b. Like the other differential latch circuits 512 to 514, the differential latch circuit 511 includes a holding unit. Thus, the differential latch circuit 511 also functions as a latch circuit that holds in the holding unit therein logic levels of the output terminals immediately before a fall of the clock signal Ck. That is, the differential latch circuit 511 also functions a differential latch circuit with as a NOR circuit function.

An output state of the differential latch circuit 511 with a NOR circuit function is determined by a combination of output logics of the differential latch circuit 512 and the differential latch circuit 514, and the entire circuit in FIG. 15 functions as a ⅓ frequency divider.

Seventh Exemplary Embodiment

FIG. 16 is a circuit block diagram of a ⅐ frequency divider 520 in a seventh example. The ⅐ frequency divider in the seventh example is constituted from the ½ frequency divider 190 in the third example and a variable frequency divider 510A of which a frequency division ratio is controlled by a state of the ½ frequency divider 190. Differential output signals of the variable frequency divider 510A are supplied as differential clock signals of the ½ frequency divider 190. A non-inverted output signal Q of the ½ frequency divider 190 is connected as a control signal of the variable frequency divider 510A.

Except that a combinatorial logic of a differential latch circuit 511A with a logic operation function is different from that of the differential latch circuit 511 in the sixth example, the variable frequency divider 510A is substantially the same as the frequency divider 510 in the sixth example in configuration and operation. One of a differential pair of the differential latch circuit 511A with a logic operation function includes three transistors of NMOS transistors 14 to 16. Sources and drains of the NMOS transistors 14 and 15 are connected in series and a source and a drain of the NMOS transistor 16 is connected in parallel with the NMOS transistors 14 and 15 connected in series. The other of the differential pair includes an NMOS transistor 17 with a gate thereof connected to a comparison reference voltage Vr3.

With this configuration, when a clock signal Ck is high and when gates of the NMOS transistors 14 and 15 both go high, or a gate of the NMOS transistor 16 goes high, the differential latch circuit 511A outputs a low level from a non-inverted signal output terminal thereof and outputs a high level from an inverted signal output terminal thereof. When logics of the NMOS transistors 14 to 16 are different from the above-mentioned states, the differential latch circuit 511A outputs the high level from the non-inverted signal output terminal thereof, and outputs the low level from the inverted signal output terminal thereof.

In the ⅐ frequency divider 520, the gate of the NMOS transistor 14 is connected to a non-inverted output signal Q of the entire ⅐ frequency circuit 520, the gate of the NMOS transistor 16 is connected to an inverted output signal Q4b of the variable frequency divider 510A, and the gate of the NMOS transistor 15 is connected to an inverted output signal Q2b. Thus, the variable frequency divider 510A alternately repeats ⅓ frequency division and ¼ frequency division according to a logic level of a non-inverted signal output terminal Q of the entire ⅐ frequency divider 520, and then ½ frequency division is performed by the ½ frequency divider 190. Thus, the circuit that performs ⅐ frequency division as a whole can be obtained.

As described above, a frequency divider having an arbitrary frequency division ratio can be implemented by combining one or more of the differential latch circuits and one or more of the differential logic circuits, as described in the third to seventh examples. As the differential logic circuit, the differential logic circuit (511 or 511A) obtained by combining the combinatorial logic circuit and the latch circuit as described in each of FIGS. 15 and 16 may be used. Alternatively, the differential latch circuit described in each of the first and second examples or the differential logic circuit in the fourth example may be used as the differential logic circuit. In either case, the differential latch circuit that constitutes the frequency divider, the current source circuit capable of controlling current that flows through the current source circuit in the differential logic circuit, and the load control circuit that performs control so that a direct-current output voltage of the differential signal output terminals is constant are included. Thus, the frequency divider having the arbitrary frequency division ratio can be obtained in which an operating current can be varied according to a required operation speed in a wide range.

Eighth Exemplary Embodiment

When the differential logic circuit described in each of the first to seventh examples (including the differential latch circuit and the ½ frequency divider) is used, current that is flown through the current source circuit can be varied in a wide range that has not been implemented so far. However, in order to set the current that is flown through the current source circuit to an optimal current value, adjustment of the current value is needed. An eighth example is an example of a frequency synthesizer having a function of adjusting the value of current that is flown through the current source circuit and a method of adjusting an operating current for the frequency synthesizer when this differential logic circuit is used for the frequency synthesizer.

Figure 3:
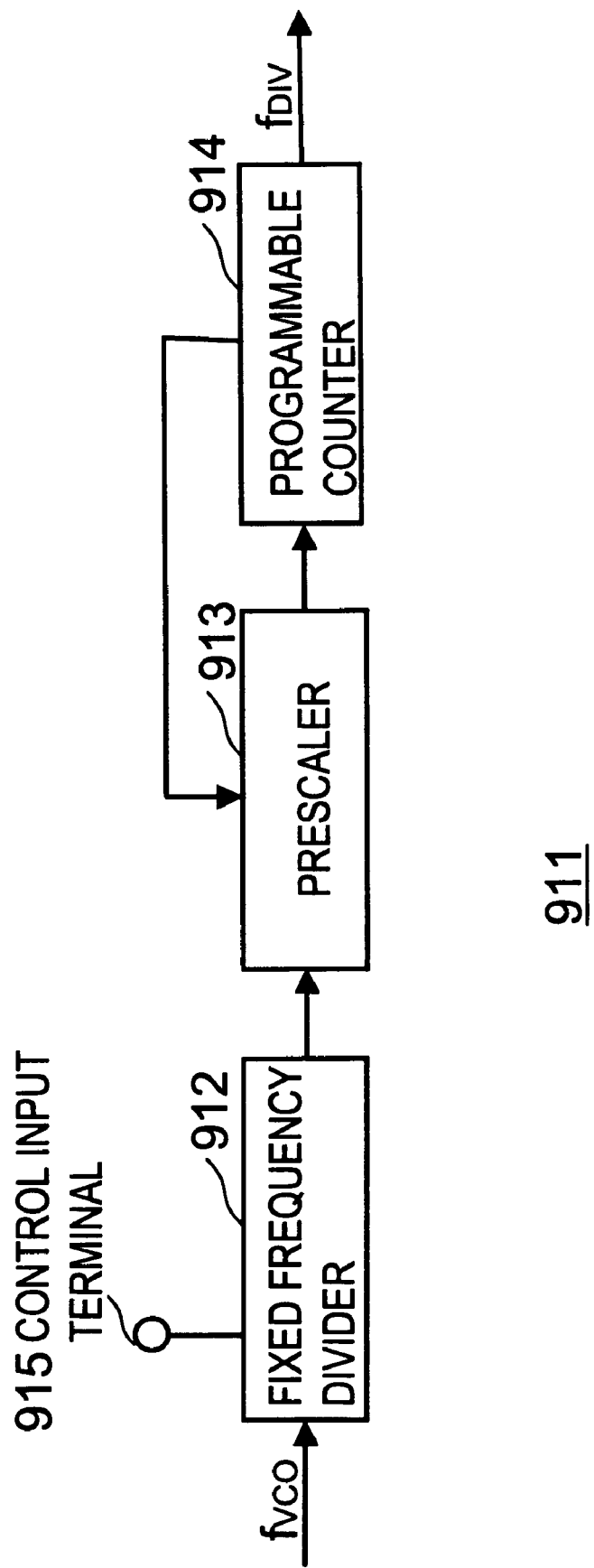
FIG. 3 is a block diagram showing a configuration of a traditional frequency divider described in Patent Document 1.

FIG. 17 is a block diagram of a frequency synthesizer 300 in the eighth example. Repeated descriptions of components of which configurations and operations are the same as those of a traditional frequency synthesizer shown in FIG. 1 are omitted. For an entirety or a part of a frequency divider 210, the differential logic circuit in one of the first to seventh examples is used. As a basic function and an internal block configuration of the frequency divider in the eighth example, the configuration of a traditional frequency divider shown in FIG. 3 can also be used without alteration. An operating current adjustment unit 310 adjusts an operating current for the differential logic circuit used for the frequency divider 210 to be suitable. A control voltage selection switch is a switch that selects supply of an output voltage VLP of a loop filter or supply of a fixed voltage Vmax at which the voltage controlled oscillator 200 is made to oscillate at an upper limit oscillation frequency, as a voltage Vcnt that controls an oscillation frequency of the voltage controlled oscillator 200. A reference clock Cref that also serves as a reference frequency of a phase comparator 220 and a clock signal Cdiv obtained by frequency dividing the oscillation clock of the voltage controlled oscillator 200 by the frequency divider 210 are supplied to the operating current adjustment unit 310. A switch selection signal is connected from the operating current adjustment unit 310 to the control voltage selection switch 320. Further, an operating current control signal Icont of a current source circuit is connected from the operating current adjustment unit 310 to the differential logic circuit of the frequency divider 210. Inside the operating current adjustment unit 310, a counter circuit and a control logic that outputs the operating current control signal to the control voltage selection switch 320 are provided.

Figure 18:
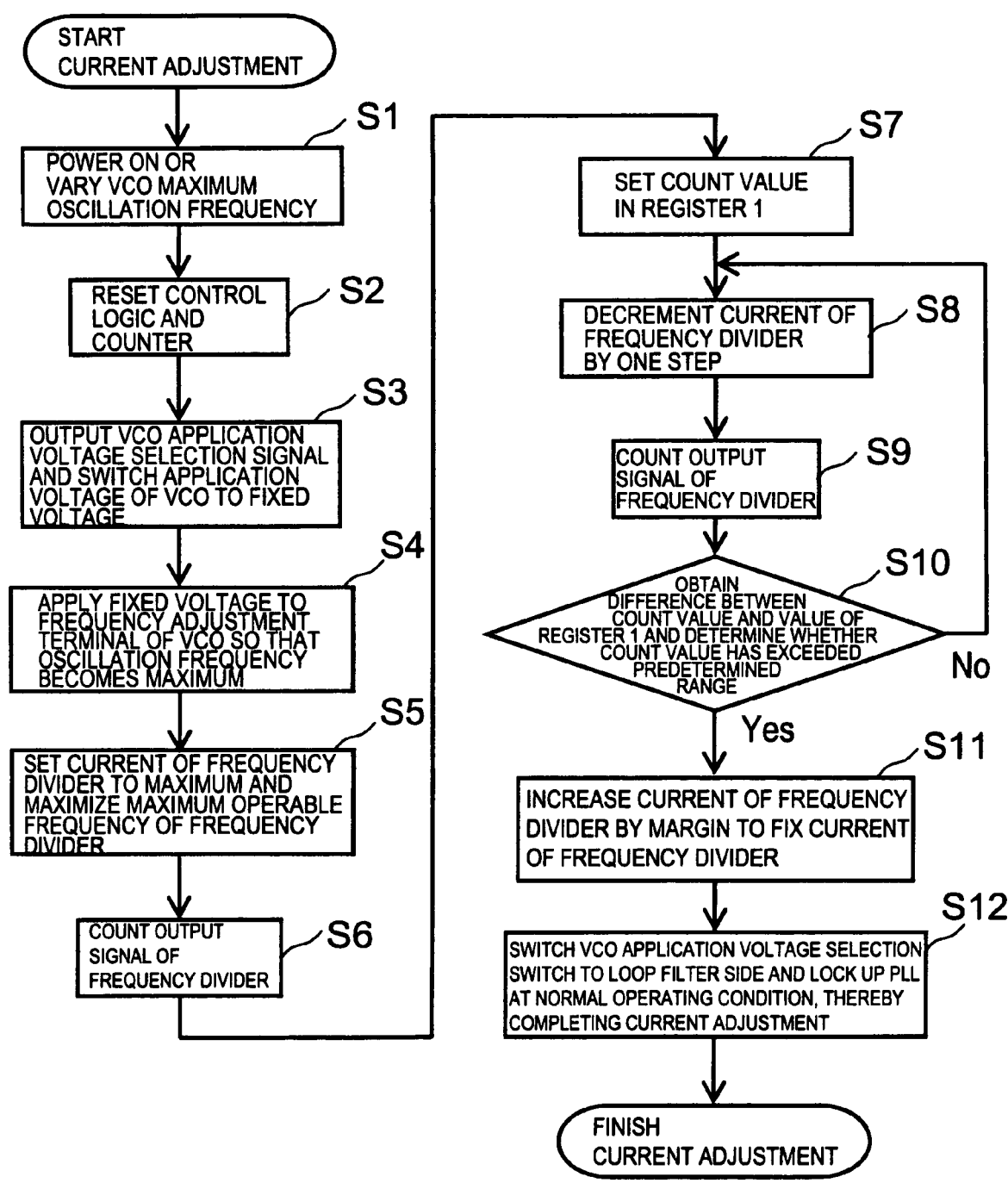
FIG. 18 is an operation flow diagram of an operating current setting method for a frequency divider in the eighth example.

Next, an operating current adjustment operation of the frequency synthesizer 300 will be described, using an operation flow diagram of an operating current setting method in FIG. 18. The operating current of the frequency divider 210 is adjusted when the frequency synthesizer is not operated such as when the frequency synthesizer is powered on or a maximum frequency of the voltage controlled oscillator is varied (in step S1). It is because, during the operating current adjustment operation, an oscillation signal synchronized with the reference clock cannot be output, as will be described below.

In the operating current adjustment operation, the operating current adjustment unit 310 is first initialized to reset the control logic and counter included in the operating current adjustment unit 310 (in step S2). Then, the operating current adjustment unit 310 causes the control voltage selection switch 320 to switch to the fixed voltage Vmax from the output VLP of the loop filter (in step S3). Then, the control voltage selection switch 320 applies the fixed voltage Vmax at which the oscillation frequency of the voltage controlled oscillator 200 becomes maximum, as the control voltage Vcnt in the form of an oscillation frequency control signal for the voltage controlled oscillator 200 (in step S4). Next, the operating current adjustment unit 310 sets the operating current of the frequency divider 210 to a maximum value. Then, the voltage controlled oscillator 200 oscillates at the maximum oscillation frequency, and the frequency divider frequency-divides an oscillation clock of the voltage controlled oscillator 200 at a maximum speed (in step S5). Next, the clock signal Cdiv frequency-divided by the frequency divider 210 is counted relative to the reference clock Cref by the counter (in step S6). The value resulting from the counting is recorded in a register 1 included in the operating current adjustment unit 310 (in step S7). A ratio of the clock signal Cdiv of the frequency divider 210 to the reference clock Cref is recorded in the register 1 as the count value. In this case, the operating current of the frequency divider 210 is set to maximum. Thus, the frequency divider 210 can frequency-divide the clock oscillated by the voltage controller oscillator without error. Thus, the count value stored in the register 1 is correct.

Next, the operating current adjustment unit 310 decrements the operating current of the frequency divider 210 by one step (in step S8). Next, the clock signal Cdiv frequency-divided by the frequency divider 210 is counted relative to the reference clock Cref by the counter (in step S9). The value resulting from this counting is compared with the counter value stored in the set register 1 to determine whether or not the frequency divider 210 can normally frequency-divide the clock (in step S10). When the frequency divider 210 can normally frequency-divide the frequency divider 210, the operation is returned to step S8 to further decrement the operating current of the frequency divider 210. As the operating current of the frequency divider 210 is decremented, an upper limit of the frequency that can be frequency-divided by the frequency divider 210 is reduced. Thus, during certain times of repetition of this loop, it occurs that the count value of the register 1 does not match the count value of the counter. Then, the operating current for being flown through the frequency divider 210 required for frequency division by the frequency divider 210 at the maximum frequency is known. Thus, after a margin has been concluded and then the adjustment has been finished, the operating current that will be flown through the frequency divider 210 is determined. The operating current of the frequency divider 210 is thereby fixed (in step S11).

Further, the operating current adjustment unit causes the control voltage selection switch to switch from the fixed voltage Vmax to the output voltage VLP of the loop filter 230, thereby completing the operating current adjustment process (in step S12).

Patent Document 1 describes that depending on a PLL operation state, an operating current of a frequency divider is varied according to a preset value of the current. Patent Document 1, however, does not adjust the set value of the current.

Needless to say, the eighth example can be applied to a frequency synthesizer including a frequency divider of which an operating current can be varied, as well as the differential logic circuit in each of the first to seventh examples.

Various modes are possible in the present invention, as described above. However, the following modes are also possible. These are given below for assurance sake.

(Mode 1) A frequency divider comprising:
 a plurality of differential latch circuits, each of the differential latch circuits comprises:
  a current source circuit;
  a pair of differential output terminals;
  a differential pair which is coupled to the pair of differential output terminal and receives one or more data signals;
  a holding circuit that holds states of the pair of differential output terminals; and
  a switch circuit which receives a pair of differential clock signals and selectively couples the differential pair or the holding circuit to the current source circuit, based on the differential clock signals; wherein the plurality of differential latch circuits are cascaded so that output signals of the differential signal output terminals in a preceding stage are supplied as the data signals in a subsequent stage, and output signals of the differential signal output terminals in one of subsequent stages are supplied as the data signals in an initial stage, the differential clock signals are supplied in common to the cascaded differential latch circuits, and frequency division is performed in synchronization with the differential clock signals (Mode 2) The frequency divider of Mode 1, wherein the plurality of differential latch circuits comprise:
 a differential latch circuit including:
  one of the differential pair including a plurality of transistors which respectively receives a plurality of the data signals, and the other of the differential pair including a transistor which receives a comparison reference voltage signal; and
  said differential latch circuit functions as a data latch with a combinatorial logic operation function which outputs a result of a combinatorial logic operation using the plurality of the data signals from the differential signal output terminals.

(Mode 3) The frequency divider of Mode 1 or 2, wherein the load control circuit is provided in common to the plurality of the differential latch circuits.

(Mode 4) The frequency divider of Mode 1, wherein the plurality of differential latch circuits comprise: a first differential latch circuit and a second differential latch circuit;
 phases of the clock signals being inverted between the first differential latch circuit and the second differential latch circuit, and the clock signals being connected in common;
 the pair of differential output terminals of the first differential latch circuit being connected to a pair of differential signal input terminals of the second differential latch circuit;
 the pair of differential output terminals of the second differential latch circuit being connected to a pair of differential signal input terminals of the first differential latch circuit;
 the load control circuit being connected in common to the first differential latch circuit and the second differential latch circuit.

(Mode 5) A frequency synthesizer comprising:
 a voltage controlled oscillator;
 a frequency divider which frequency-divides an output signal of the voltage controlled oscillator;
 a current source circuit of the frequency divider; and
 a phase comparator which compares a phase of a clock signal obtained by frequency division by the frequency divider with a phase of a reference clock signal;
 the frequency synthesizer controlling a voltage of the voltage controlled oscillator to cause the voltage controlled oscillator to oscillate at a desired frequency, based on a difference between the phases compared by the phase comparator, wherein
 the frequency synthesizer further includes;
 a control voltage selection switch which makes selection between supply of a voltage signal on the basis of the difference between the phases compared by the phase comparator and supply of a fixed voltage signal by which an oscillation frequency of the voltage controlled oscillator becomes maximum, as a signal for controlling the oscillation frequency of the voltage controlled oscillator; and an operating current adjustment unit which causes the control voltage selection switch to select the fixed voltage signal to cause the voltage controlled oscillator to oscillate at the maximum oscillation frequency, evaluates an output frequency of the frequency divider while varying the magnitude of the current that is flown through the current source circuit, and then, based on a result of the evaluation, determines the magnitude of the current that is flown through the current source circuit when the operating current adjustment unit causes the control voltage selection switch to select the voltage signal on the basis of the difference between the phases compared by the phase comparator.

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A differential logic circuit comprising:
   a differential logic unit which receives a plurality of logic signals, performs a logic operation, and outputs a result of the logic operation from a pair of differential signal output terminals thereof;
   a current source circuit which supplies controllable current to the differential logic unit;
   a load circuit connected to the pair of differential signal output terminals; and
   a load control circuit comprising a constant voltage control loop comprising:
   an input terminal for receiving a direct-current output voltage of the differential logic circuit; and
   an output terminal connected to a voltage control node of the load circuit, wherein the load control circuit is connected to the load circuit and controls a load of the load circuit such that the direct-current output voltage of the pair of differential signal output terminals is constant;
   wherein the differential logic unit comprises:
      a switch circuit which receives a pair of differential logic signals as differential clock signals and selectively connects a differential pair or a holding unit to the current source circuit, based on the differential clock signals and the differential logic circuit functions as a data latch.

2. The differential logic circuit according to claim 1, wherein the differential logic unit comprises:
   the differential pair which is connected to the pair of differential signal output terminals and receives a the plurality of logic signals as data signals;
   the holding unit that holds states of the pair of differential signal output terminals.

3. The differential logic circuit according to claim 2, wherein the plurality of logic signals comprises a pair of the differential clock signals and a pair of the data signals, the pair of data signals being a pair of differential data signals.

4. The differential logic circuit according to claim 2, wherein one of the differential pair comprises a plurality of transistors which respectively receives the plurality of the logic signals, and the other of the differential pair comprises a transistor which receives a comparison reference voltage signal; and the differential logic circuit functions as a data latch with a combinatorial logic operation function which outputs a result of a combinatorial logic operation using the plurality of the logic signals from the differential signal output terminals.

5. A frequency divider comprising a plurality of the differential logic circuits as set forth in claim 2, wherein the plurality of differential logic circuits function as a plurality of differential latch circuits, the plurality of differential logic circuits are cascaded so that output signals of the differential signal output terminals in a preceding stage are supplied as logic signals in a subsequent stage, and output signals of the differential signal output terminals in one of subsequent stages are supplied as logic signals in an initial stage, the differential clock signals are supplied in common to the cascaded differential latch circuits, and frequency division is performed in synchronization with the differential clock signals.

6. The frequency divider according to claim 5, wherein the load control circuit is provided in common to the plurality of the differential latch circuits.

7. A frequency divider, comprising:
   a first differential latch circuit and a second differential latch circuit each of which is the differential logic circuit as set forth in claim 2;
   a plurality of phases of the clock signals being inverted between the first differential latch circuit and the second differential latch circuit, and the clock signals being connected in common;
   the pair of differential output terminals of the first differential latch circuit being connected to a pair of differential signal input terminals of the second differential latch circuit;
   the pair of differential output terminals of the second differential latch circuit being connected to a pair of differential signal input terminals of the first differential latch circuit;
   the load control circuit being connected in common to the first differential latch circuit and the second differential latch circuit.

8. The differential logic circuit according to claim 1, wherein the load circuit comprises an active load circuit connected between a power supply and the pair of differential signal output terminals; and
   the load control circuit comprises a differential amplifier circuit which receives a voltage intermediate between voltages of the pair of differential signal output terminals at a first differential input terminal thereof and receives a signal of a reference voltage at a second differential input terminal thereof, and the differential amplifier circuit controls the active load circuit, based on a potential difference between the intermediate voltage and the reference voltage.

9. The differential logic circuit according to claim 8, wherein the load control circuit comprises:
   a first resistance and a second resistance having substantially equal resistance values connected in series between the pair of differential signal output terminals; and
   a voltage at a connecting point between the first resistance and the second resistance is supplied to the first differential input terminal as the intermediate voltage.

10. The differential logic circuit according to claim 8, wherein the differential amplifier circuit is a current output type differential amplifier circuit, an output terminal of the current output type differential amplifier circuit is connected to a control terminal of the active load circuit, and when the reference voltage is set to a first reference voltage, the differential amplifier circuit further comprises:
    a third resistance connected between a second reference voltage and the control terminal; and a fourth resistance connected between the control terminal and a ground.

11. The differential logic circuit according to claim 8, wherein a voltage output terminal of the differential amplifier circuit is connected to the control terminal of the active load circuit.

12. The differential logic circuit according to claim 1, wherein the differential logic unit comprising a combination of a plurality of differential pairs each of which receives the signals that are mutually different differential signals.

13. A frequency synthesizer comprising:
a voltage controlled oscillator;
a frequency divider which frequency-divides an output signal of the voltage controlled oscillator; and
a phase comparator which compares a phase of a clock signal obtained by frequency division by the frequency divider with a phase of a reference clock signal;
the frequency synthesizer controlling a voltage of the voltage controlled oscillator to cause the voltage controlled oscillator to oscillate at a desired frequency, based on a difference between the phases compared by the phase comparator, wherein the frequency divider comprises the differential logic circuit as set forth in claim 1;
a control voltage selection switch which makes a selection between supply of a voltage signal on a basis of the difference between the phases compared by the phase comparator and supply of a fixed voltage signal by which an oscillation frequency of the voltage controlled oscillator becomes a maximum, as a signal for controlling the oscillation frequency of the voltage controlled oscillator; and
an operating current adjustment unit which causes the control voltage selection switch to select the fixed voltage signal to cause the voltage controlled oscillator to oscillate at the maximum oscillation frequency, evaluates an output frequency of the frequency divider while varying a magnitude of the current that is flown through the current source circuit in the differential logic circuit, and then, based on a result of the evaluation, determines the magnitude of the current that is flown through the current source circuit when the operating current adjustment unit causes the control voltage selection switch to select the voltage signal on the basis of the difference between the phases compared by the phase comparator.

14. A frequency divider comprising:
a plurality of differential logic circuits according to claim 1, the plurality of differential logic circuits further comprising:
a differential pair coupled to the pair of differential signal output terminals;
a holding circuit that holds at least one state of the pair of differential signal output terminals; and
a switch, circuit that receives a first differential clock signal and a second differential clock signal and selectively couples the differential pair or the holding circuit to the current source circuit, based on the differential clock signals.

15. The differential logic circuit according to claim 1, wherein the load control circuit comprises:
a first resistance and a second resistance having substantially equal resistance values connected in series between the pair of differential signal output terminals; and
a differential amplifier circuit comprising:
a first input terminal which receives an, intermediate voltage between the direct-current voltages of the pair of differential signal output terminals; and
a second input terminal which receives a reference voltage.

16. A frequency divider comprising:
a plurality of differential logic circuits, the plurality of differential logic circuits comprising:
a differential logic unit which receives a plurality of logic signals, performs a logic operation, and outputs a result of the logic operation from a pair of differential signal output terminals thereof;
a current source circuit which supplies controllable current to the differential logic unit;
a switch circuit that receives a first and a second differential clock signal and selectively couples a differential pair or a holding circuit to the current source circuit, based on the first and second differential clock signals;
a load circuit connected to the pair of differential signal output terminals; and
a load control circuit comprising a constant voltage control loop comprising:
an input terminal for receiving a direct-current output voltage of the plurality of differential logic circuits; and
an output terminal connected to a voltage control node of the load circuit, wherein the load control circuit is connected to the load circuit and controls a load of the load circuit such that the direct-current output voltage of the pair of differential signal output terminals is constant.

17. The frequency divider according to claim 16, wherein the plurality of differential logic circuits further comprise: the differential pair coupled to the pair of differential signal output terminals; the holding circuit that holds at least one state of the pair of differential signal output terminals.

18. A frequency divider, comprising:
a differential logic unit which receives a plurality of logic signals, performs a logic operation, and outputs a result of the logic operation from a pair of differential signal output terminals thereof;
a current source circuit which supplies controllable current to the differential logic unit;
a load circuit connected to the pair of differential signal output terminals; and
a load control circuit comprising a constant voltage control loop comprising:
an input terminal for receiving a direct-current output voltage of the differential logic circuit; and
an output terminal connected to a voltage control node of the load circuit, wherein the load control circuit is connected to the load circuit and controls a load of the load circuit such that the direct-current output voltage of the pair of differential signal output terminals is constant;
wherein the differential logic unit comprises:
a switch circuit which receives a pair of differential logic signals as differential clock signals and selectively connects a differential pair or a holding unit to the current source circuit, based on the differential clock signals and the differential logic circuit functions as a data latch.

19. The frequency divider according to claim 18, further comprising a first differential logic unit and a second differential logic unit,
wherein a pair of differential output terminals of the first differential logic unit are connected to a pair of differential signal input terminals of the second differential logic unit, and the pair of differential output terminals of the second differential logic unit are connected to a pair of differential signal input terminals of the first differential logic unit.

* * * * *